(12) United States Patent
Tao et al.

(10) Patent No.: US 11,837,626 B2
(45) Date of Patent: Dec. 5, 2023

(54) TRANSPARENT DISPLAY APPARATUS AND GLASS PROVIDED WITH TRANSPARENT DISPLAY APPARATUS

(71) Applicant: AGC Inc., Tokyo (JP)

(72) Inventors: Yukihiro Tao, Tokyo (JP); Masahide Koga, Tokyo (JP); Remi Kawakami, Tokyo (JP)

(73) Assignee: AGC INC., Tokyo (JP)

( * ) Notice: Subject to any disclaimer, the term of this patent is extended or adjusted under 35 U.S.C. 154(b) by 579 days.

(21) Appl. No.: 16/929,324

(22) Filed: Jul. 15, 2020

(65) Prior Publication Data

US 2020/0350361 A1 Nov. 5, 2020

Related U.S. Application Data

(63) Continuation of application No. PCT/JP2019/002063, filed on Jan. 23, 2019.

(30) Foreign Application Priority Data

Jan. 25, 2018 (JP) ................................. 2018-010774

(51) Int. Cl.
*H01L 27/15* (2006.01)
*G09G 3/32* (2016.01)
*H01L 33/20* (2010.01)

(52) U.S. Cl.
CPC ............. *H01L 27/156* (2013.01); *G09G 3/32* (2013.01); *H01L 33/20* (2013.01)

(58) Field of Classification Search
CPC ....... H01L 27/156; H01L 33/20; H01L 33/42; H01L 33/62; H01L 25/0756; H01L 25/0753; G09G 3/32
See application file for complete search history.

(56) References Cited

U.S. PATENT DOCUMENTS

| 8,039,847 B2 | 10/2011 | Nuzzo et al. |
| 2006/0238326 A1 | 10/2006 | Repetto et al. |
| 2007/0200111 A1* | 8/2007 | Itoh ................... G02F 1/133553 257/59 |

(Continued)

FOREIGN PATENT DOCUMENTS

| CN | 107533398 A | 1/2018 |
| JP | 2006-301650 A | 11/2006 |

(Continued)

OTHER PUBLICATIONS

International Searching Authority, "International Search Report," issued in connection with International Patent Application No. PCT/JP2019/002063, dated Apr. 2, 2019.

(Continued)

*Primary Examiner* — Ratisha Mehta
(74) *Attorney, Agent, or Firm* — Foley & Lardner LLP

(57) ABSTRACT

A transparent display apparatus includes a first transparent substrate, light emitting units arranged for respective pixels on the first transparent substrate, and a strip unit connected to the light emitting units, wherein each of the light emitting units includes at least one light emitting diode having a size of area of 10,000 μm² or less, and a size of area having a transmittance of 20% or less accounts for 30% or less of a display area.

20 Claims, 20 Drawing Sheets

(56) References Cited

U.S. PATENT DOCUMENTS

| | | | |
|---|---|---|---|
| 2012/0319561 A1* | 12/2012 | Shin | G02F 1/133602 |
| | | | 445/24 |
| 2015/0371585 A1 | 12/2015 | Bower et al. | |
| 2016/0202833 A1* | 7/2016 | Kim | G06F 3/0443 |
| | | | 345/173 |
| 2017/0187976 A1 | 6/2017 | Cok | |
| 2017/0190200 A1* | 7/2017 | Usami | B41M 5/30 |
| 2017/0250240 A1 | 8/2017 | Lee et al. | |
| 2017/0292681 A1 | 10/2017 | Lin et al. | |
| 2018/0012554 A1* | 1/2018 | Chen | G02F 1/136286 |
| 2018/0046288 A1 | 2/2018 | Tsukamoto | |
| 2019/0043844 A1* | 2/2019 | Liu | H01L 25/167 |
| 2019/0173057 A1* | 6/2019 | Jung | H10K 50/86 |
| 2019/0197282 A1* | 6/2019 | Gong | G02F 1/133512 |
| 2020/0027388 A1* | 1/2020 | Iwaki | H04N 13/332 |

FOREIGN PATENT DOCUMENTS

| | | |
|---|---|---|
| JP | 2017-151339 A | 8/2017 |
| JP | 2017-521859 A | 8/2017 |
| WO | WO-2014/050876 A1 | 4/2014 |

OTHER PUBLICATIONS

International Searching Authority, "Written Opinion," issued in connection with International Patent Application No. PCT/JP2019/002063, dated Apr. 2, 2019.

* cited by examiner

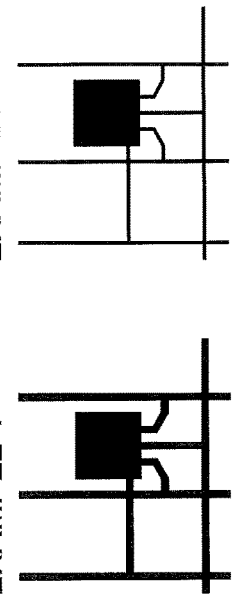
FIG.14A
EXAMPLE 1
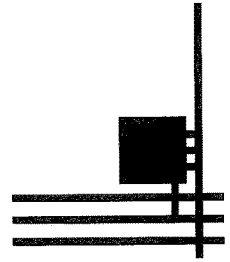
FIG.14B
EXAMPLE 2
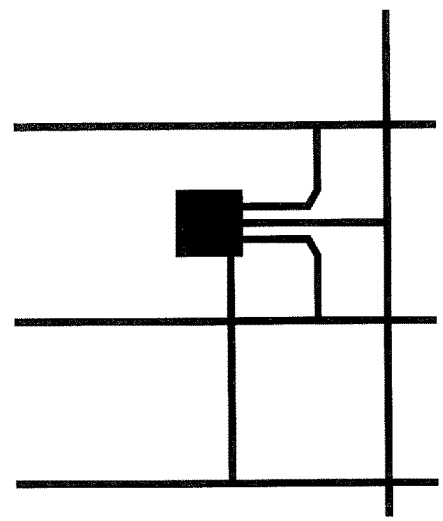
FIG.14C
EXAMPLE 3
FIG.14D
EXAMPLE 4
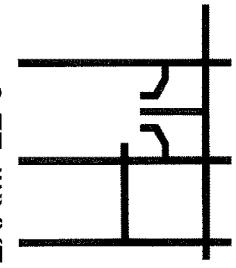
FIG.14E
EXAMPLE 5
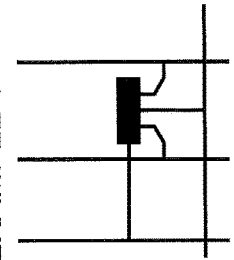
FIG.14F
EXAMPLE 6
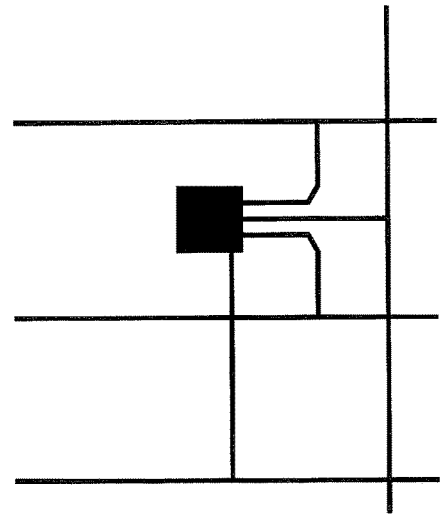
FIG.14G
EXAMPLE 7
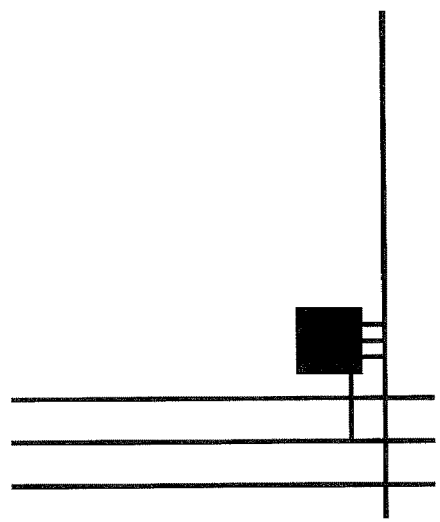
FIG.14H
EXAMPLE 8

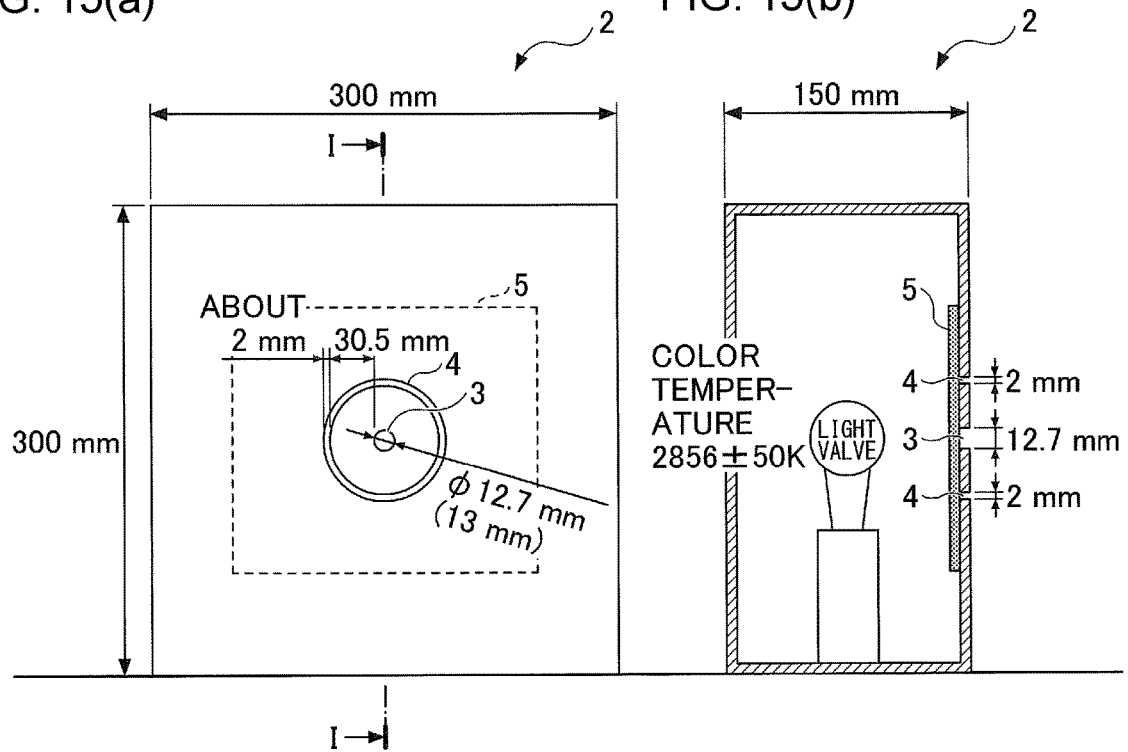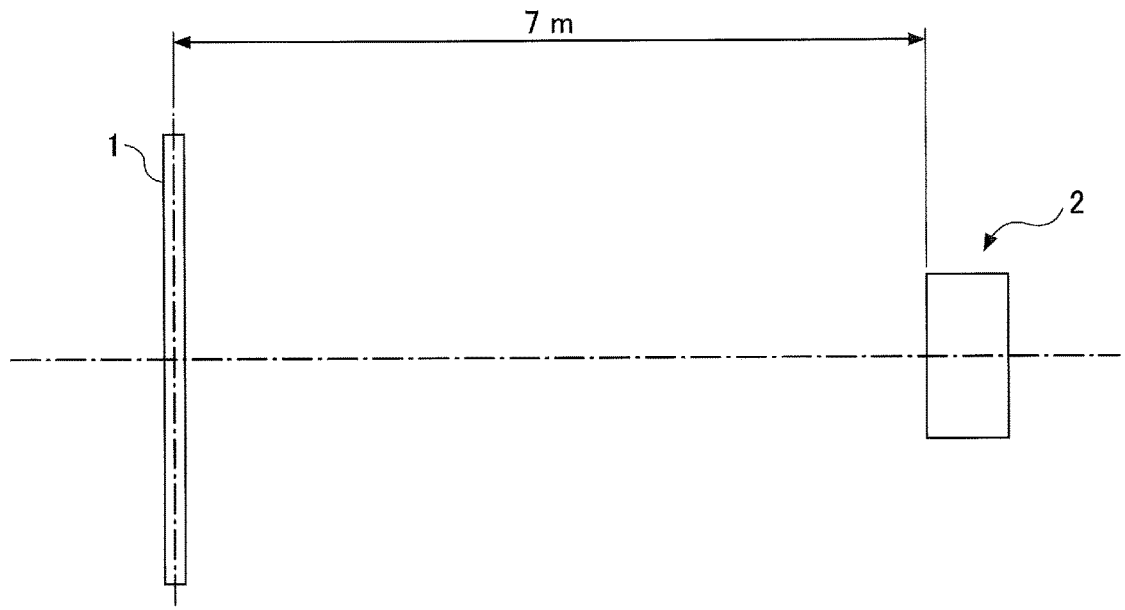

FIG.16A
EXAMPLE 9
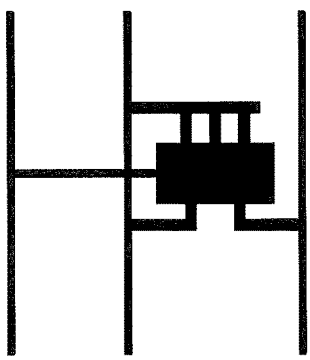
FIG.16B
EXAMPLE 10
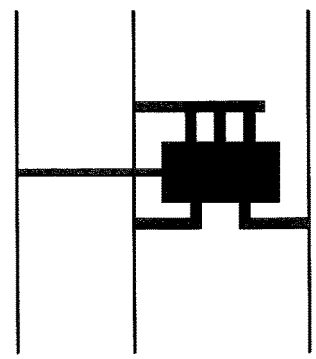
FIG.16C
EXAMPLE 11
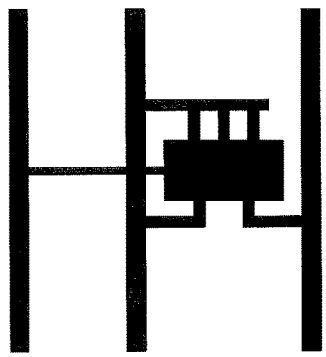
FIG.16D
EXAMPLE 12
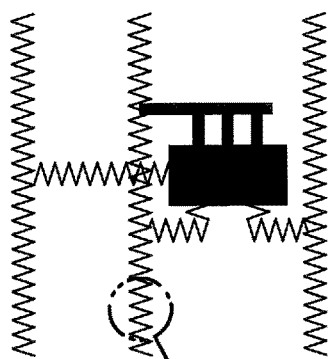
FIG.16E
EXAMPLE 13
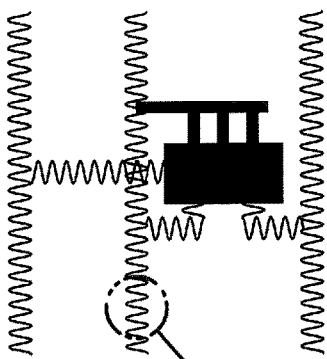
FIG.16F
EXAMPLE 14
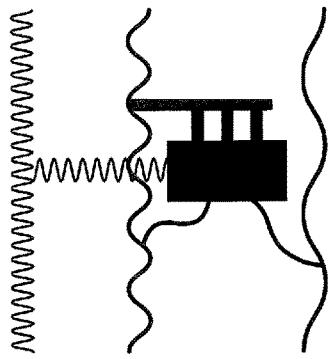
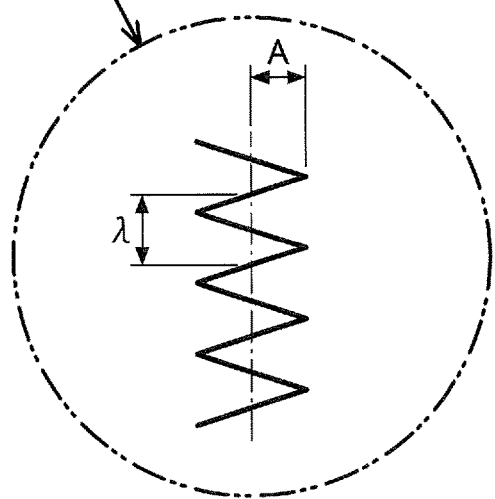
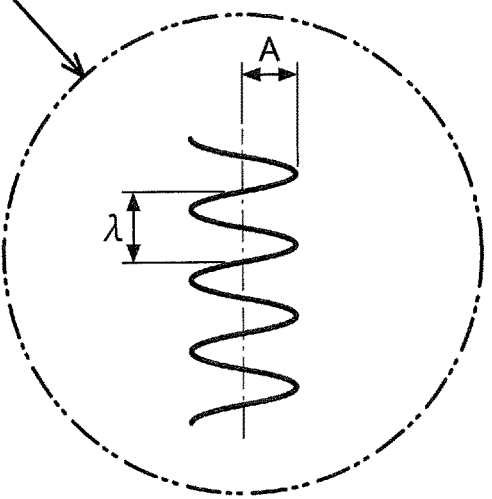

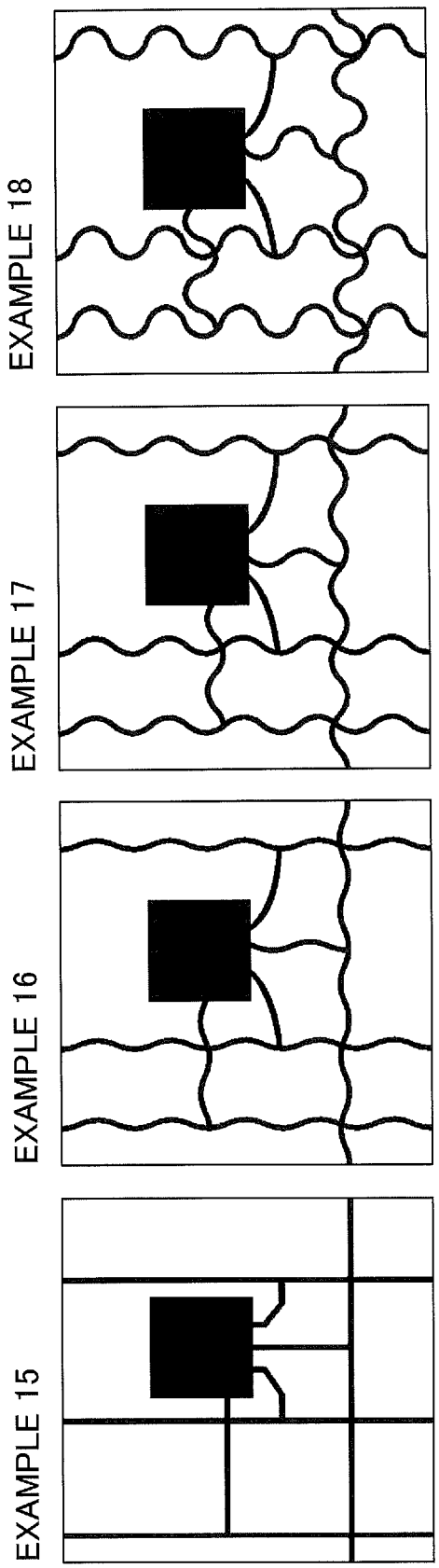

FIG.18A
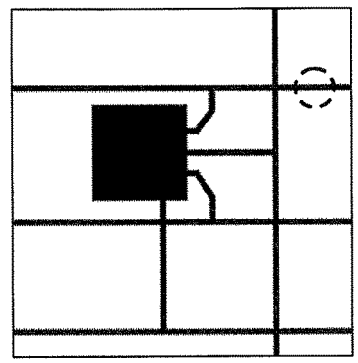
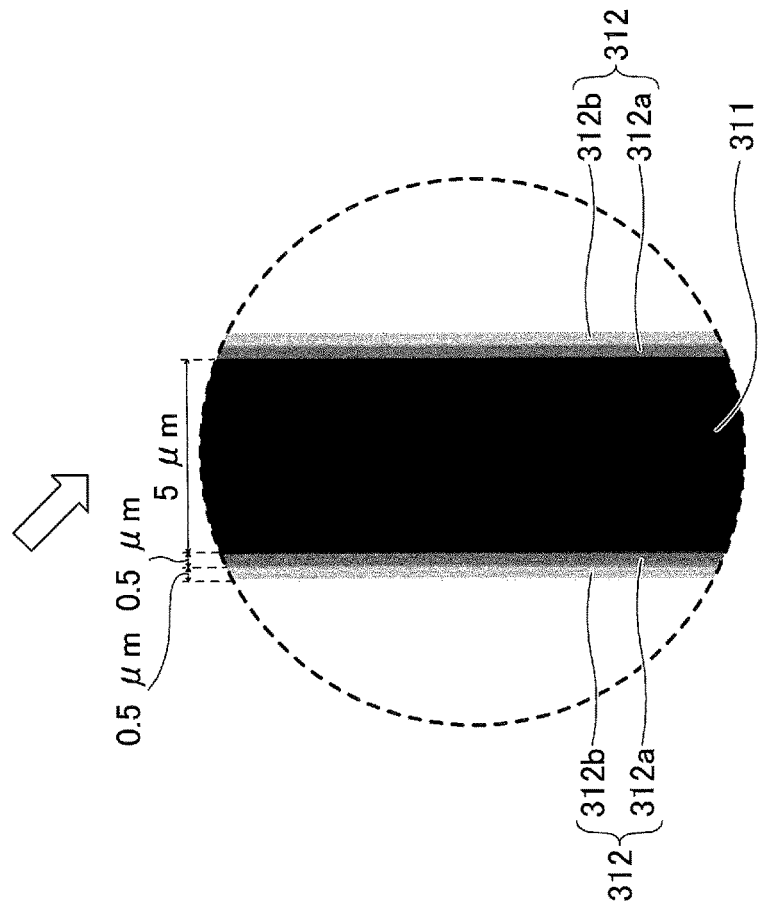
FIG.18B
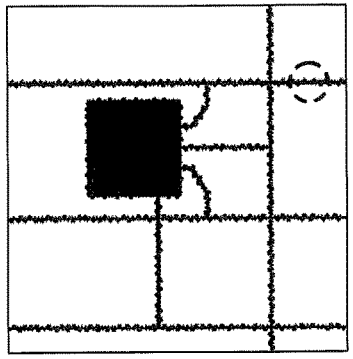
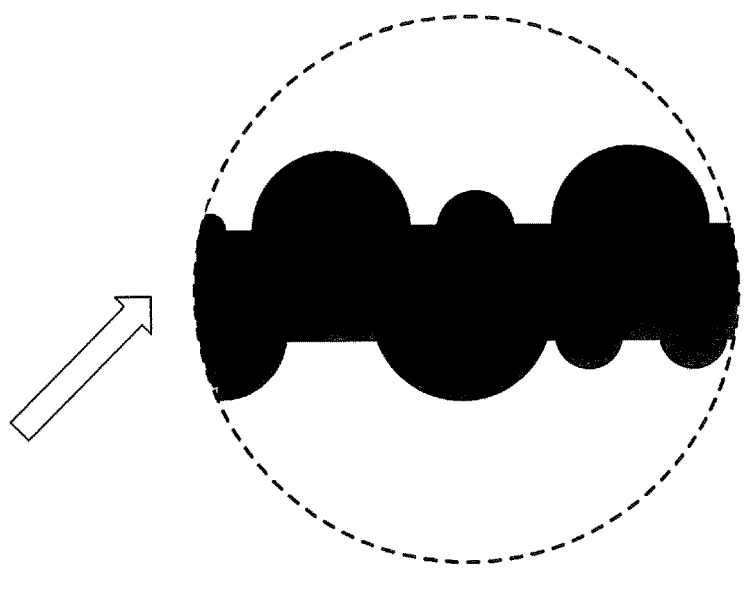

EXAMPLE 21

EXAMPLE 22

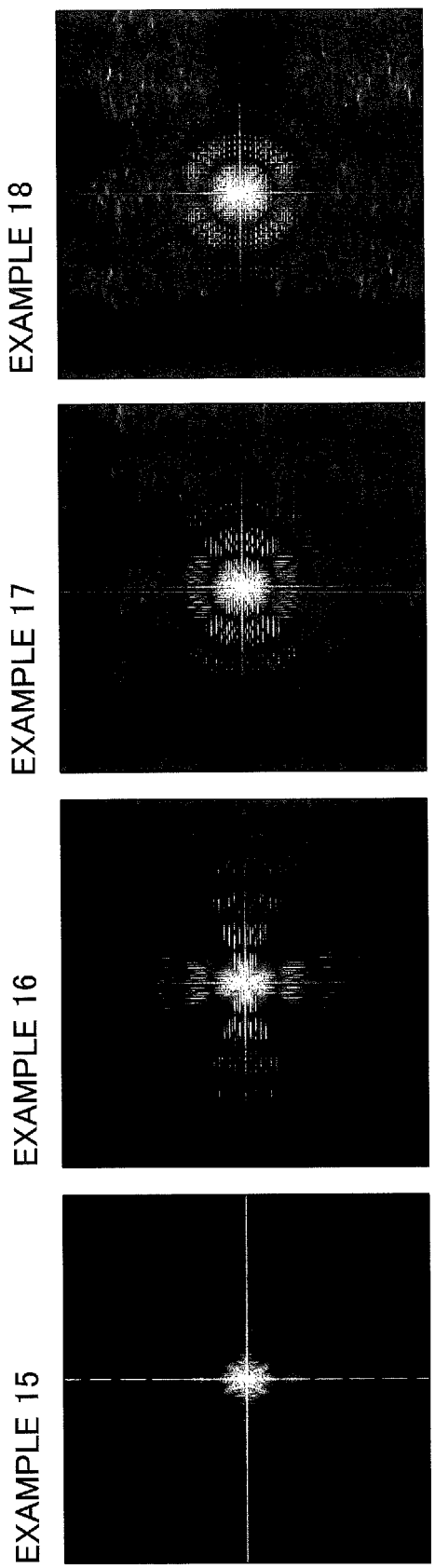

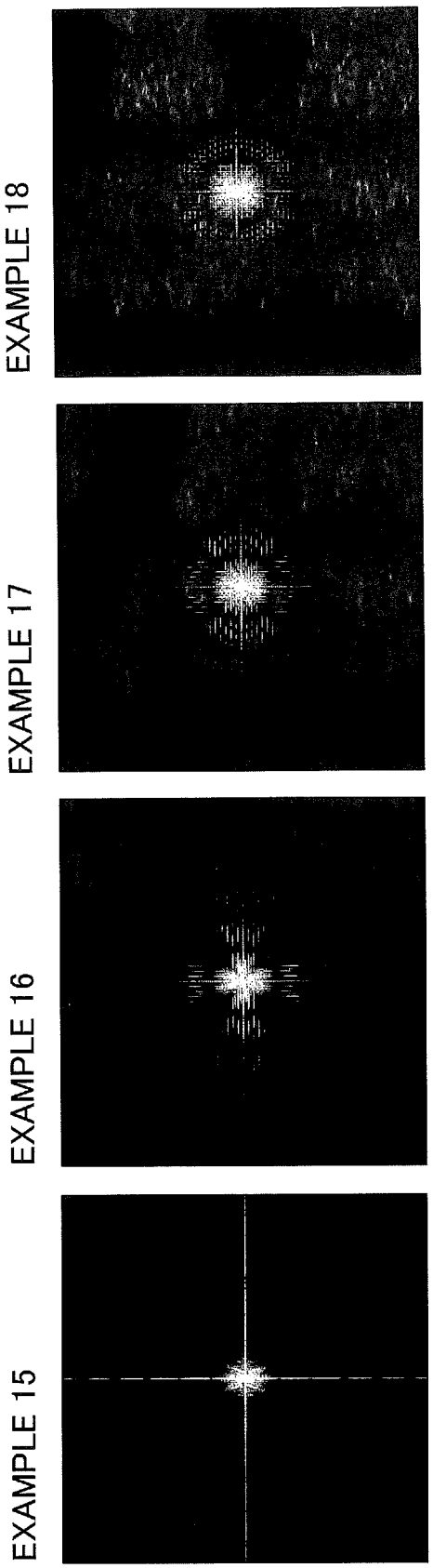

TRANSPARENT DISPLAY APPARATUS AND GLASS PROVIDED WITH TRANSPARENT DISPLAY APPARATUS

CROSS-REFERENCE TO RELATED APPLICATION

The present application is a continuation application filed under 35 U.S.C. 111 (a) claiming benefit under 35 U.S.C. 120 and 365 (c) of PCT International Application No. PCT/JP2019/002063 filed on Jan. 23, 2019 and designating the U.S., which claims priority to Japanese Patent Application No. 2018-010774 filed on Jan. 25, 2018. The entire contents of the foregoing applications are incorporated herein by reference.

BACKGROUND OF THE INVENTION

1. Field of the Invention

The present invention relates to a transparent display apparatus and a glass provided with a transparent display apparatus.

2. Description of the Related Art

Conventionally, display apparatuses using light emitting diodes as display pixels are known. Further, among such display apparatuses, a display apparatus in which an image on the back surface side can be visually recognized through the apparatus is known. For example, Japanese Laid-Open Patent Publication No. 2006-301650 describes a transparent apparatus for displaying information superimposed on a background and having multiple LED light sources addressable by conductive pathways deposited on a transparent lower layer.

SUMMARY OF THE INVENTION

Technical Problem

However, in order to secure an appropriate display performance in the transparent apparatus as described in Japanese Laid-Open Patent Publication No. 2006-301650, the complexity of the arrangement of constituent elements such as strips is to be increased. Therefore, the transparency of the screen is reduced, and visual recognize of an image on the back surface side of the display apparatus may be less likely.

In view of the above issues, according to an aspect of the present invention, in a transparent display apparatus having light emitting diodes, it is an object to improve the transparency while securing an appropriate display performance.

Solution to Problem

In order to solve the above problem, an aspect of the present invention is a transparent display apparatus including a first transparent substrate, light emitting units arranged for respective pixels on the first transparent substrate, and a strip unit connected to the light emitting units, wherein each of the light emitting units includes at least one light emitting diode having a size of area of 10,000 µm$^2$ or less, and a size of area having a transmittance of 20% or less accounts for 30% or less of a display area.

Effect of Invention

According to an aspect of the present invention, in a transparent display apparatus having light emitting diodes, the transparency can be improved while securing an appropriate display performance.

BRIEF DESCRIPTION OF THE DRAWINGS

FIGS. 14A to 14H are drawings illustrating photomask patterns used in Examples 1 to 8.

FIGS. 15 (*a*), 15 (*b*), and 15 (*c*) are drawings for explaining an apparatus used for double image test conducted on Examples.

FIGS. 16A to 16F are drawings illustrating image patterns used in Examples 9 to 14.

FIGS. 17A to 17D are drawings illustrating image patterns used in Examples 15 to 18.

FIGS. 18A and 18B are drawings illustrating image patterns used in Example 19 and Example 20.

FIGS. 20A to 20D are drawings illustrating simulation images of diffracted light images of Examples 15 to 18.

FIGS. 22A to 22D are drawings illustrating filtered simulation images of the diffracted light images of Examples 15 to 18.

DETAILED DESCRIPTION OF THE PREFERRED EMBODIMENTS

Figure 1:
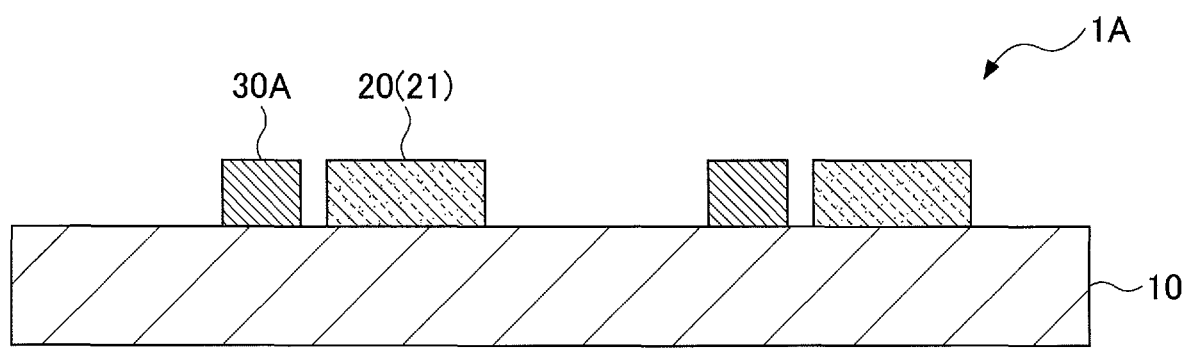
FIG. 1 is a schematic cross sectional view for explaining a basic configuration of a transparent display apparatus according to a first embodiment.

Hereinafter, modes for carrying out the present invention will be described. In each drawing, the same or corresponding elements may be denoted with the same or corresponding reference numerals and the description thereof may be omitted. The present invention is not limited to the following embodiments.

According to an aspect of the present invention, a transparent display apparatus includes a first transparent substrate, light emitting units arranged for respective pixels on the first transparent substrate, and a strip unit connected to the light emitting units, wherein each of the light emitting units includes at least one light emitting diode having a size of area of 10,000 μm² or less, and a size of area having a transmittance of 20% or less accounts for 30% or less of a display area.

In the present specification, the "transparent display apparatus" refers to a display apparatus in which visual information such as a person or a background located on the back surface side (the side opposite to the observer) of the display apparatus is visually recognizable in a desired usage environment. It should be noted that whether being "visually recognizable" is determined at least when the display apparatus is in a non-display state, i.e., in a state in which the display apparatus is not energized.

Also, in the present specification, being "transparent" (or having translucency) means that the transmittance of visible light is 40% or more, preferably 60% or more, and more preferably 70% or more. Alternatively, being "transparent" (or having translucency) may mean a display apparatus with a transmittance of 5% or more and a haze of 10 or less. In a case where the transmittance is 5% or more, the outdoors can be seen, when the outdoors are seen from a room in the daytime, with the same or higher brightness than the brightness of the room, and therefore, a sufficient visibility can be secured. In a case where the transmittance is 40% or more, even when the brightness at the observer side and the brightness at the other side of the transparent display apparatus (the back surface side) are about the same, the other side of the transparent display apparatus can be visually recognized substantially without any problem. In a case where the haze is 10 or less, the contrast of the background can be secured at 10, so that the other side of the transparent display apparatus can be virtually recognized substantially without any problem. "Transparent" may or may not be with color, that is, "transparent" may be transparent without any color or transparent with color. Note that the transmittance refers to a value (%) measured by a method conforming to ISO9050. The haze refers to a value measured by a method according to ISO14782.

In the present specification, a "display area" is an area where an image (including characters) is displayed in a transparent display apparatus, and refers to a maximum range in which the brightness can be changed by light emitting units.

First Embodiment

FIG. 1 illustrates a cross sectional view for explaining a basic structure of a transparent display apparatus 1A according to the first embodiment of the present invention. As illustrated in the drawing, the transparent display apparatus 1A may include a transparent substrate 10, a light emitting unit 20 (a light emitting diode 21) arranged on a principal surface of the transparent substrate 10, and a strip unit 30A also arranged on the principal surface of the transparent substrate 10.

Figure 2:
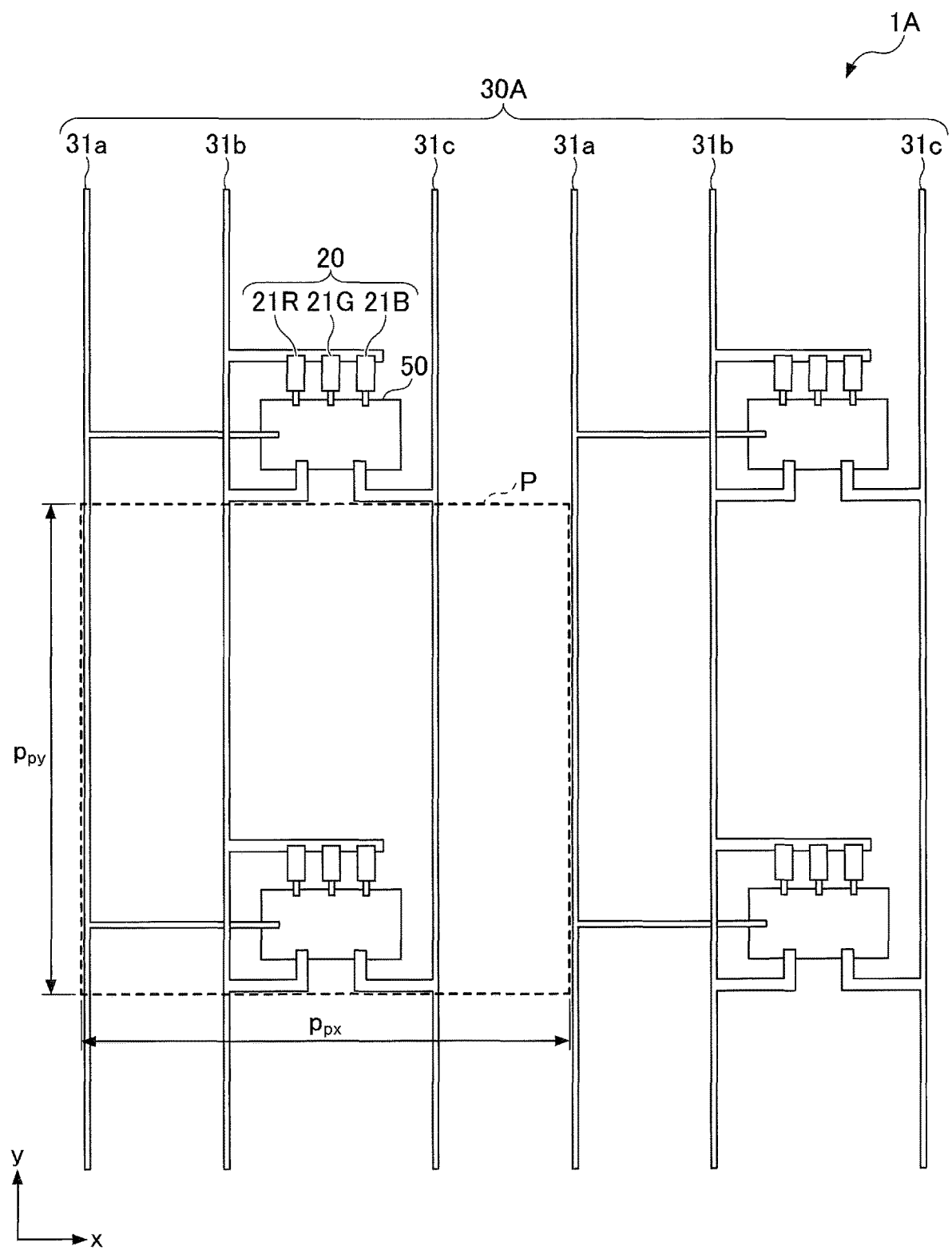
FIG. 2 is a schematic plan view of the transparent display apparatus according to the first embodiment.

FIG. 2 illustrates a schematic partial plan view of a transparent display apparatus 1A according to the first embodiment. FIG. 2 illustrates an example of an area in which two pixels are arranged in each of the row direction and the column direction in the drawing (i.e., the x direction and the y direction, respectively, in the drawing), which amounts to four pixels in total. As illustrated in FIG. 2, the light emitting units 20 may be arranged in the row direction and the column direction (the x direction and the y direction, respectively, in the drawing) in the display area, i.e., in a matrix shape (lattice shape). However, the arrangement of the light emitting units 20 is not limited to the matrix form, and may be arranged in other arrangement forms in which the light emitting units of the same color are arranged at a certain interval in a particular direction, such as a staggered pattern (an offset pattern).

Each pixel (also referred to as a display pixel) of the transparent display apparatus 1A is provided with one of the multiple light emitting units 20. That is, each of the light emitting units 20 corresponds to a single pixel of the display apparatus 1A, and a single light emitting unit 20 constitutes a single pixel.

Each of the light emitting units 20 includes at least one light emitting diode (LED). Therefore, in the present embodiment, at least one LED constitutes each pixel of the transparent display apparatus 1A. As described above, the transparent display apparatus 1A according to the present embodiment is a display apparatus using LEDs as pixels, and is what is termed as an LED display (an LED display apparatus).

Each of the light emitting units 20 may include two or more LEDs. For example, each of the light emitting units 20 may include three LEDs with wavelengths different from each other. More specifically, as in the illustrated embodiment, each light emitting unit 20 may include a red LED 21R, a green LED 21G, and a blue LED 21B (which may be hereinafter, collectively referred to as an LED 21). Each LED corresponds to sub-pixels to constitute a single pixel. In this way, each of the light emitting units 20 has LEDs that can emit the three primary colors of light (R, G, B), so that the LEDs of three colors make a group to constitute a single pixel. Accordingly, a full color image can be displayed. Also, each of the light emitting units 20 may include two or more LEDs of similar colors. In this case, the dynamic range of the video can be increased.

The LED used in the present embodiment is what is termed as a micro LED in a very small size. Specifically, the width of the LED when placed on the transparent substrate 10, i.e., the length in the row direction (the x direction), may be 100 μm or less, preferably 50 μm or less, and more preferably 20 μm or less. The length of the LED when placed on the transparent substrate 10, i.e., the length in the column direction (the y direction) may be 100 μm or less, preferably 50 μm or less, and more preferably 20 μm or less. The lower limit of the width and the length of the LED is not particularly limited, but is preferably 3 μm or more in order to reduce the edge effect, in view of various manufacturing conditions.

The size of area occupied by a single LED on the transparent substrate 10 is 10,000 μm² or less. This size of area is preferably 1,000 μm² or less, and more preferably 100 μm² or less. The lower limit of the size of area occupied by a single LED on the transparent substrate 10 may be 10 μm² or more, in view of various manufacturing conditions and the like. In the present specification, the size of area occupied by constituent members such as LEDs, strips, and the like and the size of area occupied by a strip unit in an area of a single pixel may be a size of area in a plan view.

In most cases, the smallest size of an object of which thickness can be seen by a person with a visual acuity of 1.5 in decimal in an image at a distance of 1 meter is 50 μm, and it is said that it is less likely to recognize an object having a size of 15 μm or less with the naked eye. Therefore, the very small LEDs as explained above are used, so that even when an observer observes a display apparatus relatively closely, for example, at a distance of several dozen cm to about 2 m, the LEDs cannot be visually recognized, or even if the LEDs are visually recognized, their presence is unnoticeable, and therefore, the visibility of images at the back surface side of the display apparatus can be enhanced.

Also, when a flexible material is used as the transparent substrate 10, even if the obtained display apparatus is bent, the LEDs can appropriately function as the pixels without being damaged, because the very small LEDs as described above are used. Therefore, even when the display apparatus according to the present embodiment is used as being attached to a plate-like body having a curved surface, for example, a plate-like body bent in two directions orthogonal to each other, or even when the display apparatus according to the present embodiment is used as being sealed between two such plate-like bodies, the display apparatus would not be appreciably damaged.

The transparency of the LED itself is low, and, for example, the transmittance of the LED is about 10% or less. The reason for this is that an electrode or a mirror structure for efficiently extracting light to one side is formed on the upper surface or the lower surface of the LED. Therefore, with the use of the very small LEDs, the area where the LEDs block the transmission of light can be reduced, and an area of a low transmittance (for example, the area of which the transmittance is 20% or less) can be reduced in the display area. In addition, with the use of the very small LEDs, an area of a high transmittance is increased in the pixel, so that the transparency of the display apparatus is improved, and the visibility of the image on the back surface side can be improved. In addition, the degree of flexibility in the configuration of elements other than the light emitting units such as strips and the like can be increased while a high transparency of the display apparatus is secured.

The type of LEDs used is not limited, but the LEDs can be of chip type. The LEDs may be unpackaged, may be wholly sealed in a package, or may be at least partially covered with resin. The covering resin may have a lens function to improve the light utilization rate and the extraction efficiency to the outside. In such case, a single LED may be sealed in a package, or three LEDs that emit lights of different wavelengths may be sealed in a package (3-in-1 chip), or an LED may be configured to emit light of the same wavelength but allow different types of lights to be extracted with fluorescent substances and the like. In a case where the LEDs are packaged, the size of area occupied by a single LED and the dimensions of the LED (the x direction dimension and the y direction dimension) mean a size of area and dimensions, respectively, after packaging. In a case where three LEDs are sealed in a single package, the size of area of each LED may be one third or less of the total package area.

The shape of the LED is not particularly limited, but may be a rectangle, a square, a hexagon, a conic structure, a pillar shape, or the like.

The LEDs can be implemented by growing the LEDs by a liquid phase growth method, HDVPE method, MOCVD method, or the like, and cutting the LEDs. Also, the LEDs can be peeled off from a semiconductor wafer and transferred onto the substrate by micro transfer printing or the like.

The material of the LEDs is not particularly limited, but is preferably an inorganic material. For example, the material of the light emitting layer is preferably AlGaAs, GaAsP, GaP, or the like for the red LED, preferably InGaN, GaN, AlGaN, GaP, AlGaInP, ZnSe, or the like for the green LED, and preferably InGaN, GaN, AlGaN, ZnSe, or the like for the blue LED.

The light emitting efficiency (energy conversion efficiency) of the LED is preferably 1% or more, more preferably 5% or more, and still more preferably 15% or more. With the use of the LEDs having the light emission efficiency of 1% or more, a sufficient brightness can be obtained even when the size of the LED is very small as described above, which enables the use as a display member in the daytime. When the light emitting efficiency of the LED is 15% or more, the amount of heat to be generated and the like can be reduced, and the LEDs can be readily sealed in the laminated glass with a resin adhesive layer.

As illustrated in FIG. 2, the light emitting units 20 are arranged with predetermined intervals. A pitch between light emitting units 20 corresponds to a pitch of pixels. In FIG. 2, a pixel pitch in the x direction is denoted as $p_{px}$, and a pixel pitch in the y direction is denoted as $p_{py}$. In the present specification, the pixel pitch means at least one of the pixel pitch $p_{px}$ in the x direction and the pixel pitch $p_{py}$ in the y direction.

The pixel pitch $p_{px}$ may be 100 to 3000 μm, preferably 180 to 1000 μm, and more preferably 250 to 400 μm. The pixel pitch $p_{py}$ may be 100 to 3000 μm, preferably 180 to 1000 μm, and more preferably 250 to 400 μm. A size of area P of a single pixel can be expressed as $p_{px} \times p_{py}$. The size of area of a single pixel may be $1 \times 10^4$ μm² to $9 \times 10^6$ μm², preferably $3 \times 10^4$ to $1 \times 10^6$ μm², and more preferably $6 \times 10^4$ to $2 \times 10^6$ μm².

When the pixel pitch is set to the above range, a high translucency can be achieved while a sufficient display performance is secured. In addition, a diffraction phenomenon that could be caused by light from the back surface side of the transparent display apparatus can be alleviated or prevented.

A pixel density in a display area of the display apparatus according to the present embodiment may be 10 ppi or more, preferably 30 ppi or more, and more preferably 60 ppi or more.

The pixel pitch explained above may correspond to a pitch of LEDs of the same color included in the light emitting units 20. For example, the pixel pitch $p_{px}$ in the x direction may correspond to a pitch of the red LEDs 21R in the x direction, and the pixel pitch $p_{py}$ in the y direction may correspond to a pitch of the red LEDs 21R in the y direction.

The size of area of a single pixel may be selected as appropriate according to the size, purpose, viewing distance, or the like of the screen or the display area. When the size of area of a single pixel is $1 \times 10^4$ μm$^2$ to $9 \times 10^6$ μm$^2$, the transparency of the display apparatus can be improved while an appropriate display performance is secured.

The size of area of each LED may be 30% or less, preferably 10% or less, more preferably 5% or less, and still more preferably 1% or less, with respect to the size of area of the single pixel. When the size of area of each LED is 30% or less with respect to the size of area of the single pixel, the transparency and the visibility of images at the back surface side of the display apparatus can be improved.

The total sizes of areas occupied by LEDs in the display area may be 30% or less, preferably 10% or less, more preferably 5% or less, and still more preferably 1% or less.

In FIG. 2, the red LED 21R, the green LED 21G, and the blue LED 21B are arranged in line in the x direction in each pixel, but the arrangement of the three LEDs is not limited to the arrangement illustrated in the figure. For example, the order of arrangement of the three LEDs may be changed into a sequence of the green LED 21G, the blue LED 21B, and the red LED 21R. Also, the direction of the arrangement of the three LEDs may be changed into the y direction. Alternatively, instead of arranging the three LEDs 21R, 21G, and 21B in a row, the LEDs may be arranged at the apexes of a triangle.

In a case where each light emitting unit 20 includes multiple LEDs, the interval between LEDs in each pixel (i.e., in each light emitting unit 20) is preferably 100 μm or less and more preferably 10 μm or less. Also, in each of the light emitting units 20, multiple LEDs may be arranged to be in contact with each other. Accordingly, the power strip can be readily shared, and the aperture ratio can be improved.

In a case where each of the light emitting units 20 includes multiple LEDs, the order of arrangement, the direction of arrangement, or the like of multiple LEDs in each pixel may be the same as each other, or may be different. In a case where each of the light emitting units 20 includes three LEDs emitting lights of different wavelengths, the LEDs may be arranged in the x direction or the y direction in some of the light emitting units 20, and the LEDs of respective colors may be arranged at apexes of triangles in some other of the light emitting units 20.

As illustrated in FIG. 2, the display apparatus 1A is provided with a strip unit 30A on the principal surface of the transparent substrate 10. The strip unit 30A is constituted by multiple strips of linear-shaped bodies. In the illustrated example, the strip unit 30A includes data lines (data signal lines) 31a, power supply lines 31b, and ground lines 31c (each of which may be simply referred to as a strip 31) extending in the y direction. Each of these strips is connected to respective light emitting units 20, and each of the light emitting units 20 can be controlled individually. In a case where the display apparatus 1A includes an IC chip 50 to be explained later, each of the strips may be connected to at least one of the light emitting units 20 and the IC chip 50. In a case where the strip is connected to at least one of the light emitting units 20 and the IC chip 50, the strip 31 may branch off in proximity to the light emitting unit 20 or the IC chip 50 as illustrated in the drawing. The branched off strips may extend in the x direction as illustrated in the drawings.

Examples of materials of the strips of the strip unit 30A include: metals such as copper, aluminum, silver and gold; and carbon nanotubes and the like. Among these materials, copper is preferred because of its low resistivity. The surfaces of the strips of the strip unit 30A may have a dark color such as black or brown. To darken the color of the strips of strip unit 30A, the surface may be coated, for example, the surface may be coated with titanium, molybdenum, chromium, tungsten, copper oxide, molybdenum oxide, titanium nitride, carbon, and the like. At this time, the refractive index of the material coating the surface of the strip unit 30A is preferably close to the refractive index of other transparent members, such as a transparent substrate, that are in proximity because reflection can be suppressed and stray light can be absorbed. For example, the real part of the refractive index of the dark-colored material is preferably 3.0 or less, more preferably 2.0 or less, and still more preferably 1.3 to 1.7.

A dark-colored compound may be formed on the surface of the material of the strips of the strip unit 30A, and for example, copper oxide, aluminum hydroxide, silver chloride, silver sulfide, copper (II) oxide, copper (II) sulfide, and the like can be formed, by oxidation treatment, hydroxylation treatment, chlorination treatment, sulfidation treatment, and the like, on the surface to be dark-colored.

Also, the dark-colored surface is preferably matted. In the matte treatment, a roughness Ra is preferably 0.05 μm or more and 5 μm or less, and more preferably, the roughness Ra is 0.1 μm or more and 2 μm or less.

By darkening the color of the surface of the strip unit 30A, generation of diffracted light of reflected light is reduced. Therefore, this is effective for improving the contrast of images and improving the background visibility. In addition, reductions of diffracted light of light from a light source, reflected light from a transparent substrate, light propagating inside the transparent substrate, and the like are achieved, and transparency and stray light resistance can be enhanced, which used to be more difficult to handle with the transparent display apparatus 1A as compared with opaque display apparatuses.

The width of each strip included in the strip unit 30A is preferably 100 μm or less, more preferably 50 μm or less, and still more preferably 15 μm or less. As explained above, the smallest size of an object of which thickness can be seen by a person with a visual acuity of 1.5 in decimal in an image at a distance of 1 meter is 50 μm, and it is said that it is less likely to recognize an object having a size of 15 μm or less with the naked eye. Therefore, when the line width is set to 100 μm or less, preferably 50 μm or less, even when an observer observes the display apparatus relatively closely, for example, at a distance of several dozen cm to about 2 m, the strip unit cannot be visually recognized, or even if the strip unit is visually recognized, their presence is unnoticeable. Therefore, the visibility of images at the back surface side of the display apparatus can be enhanced.

In a case where the transparent display apparatus 1A is irradiated with light from the outside, irregular reflection may occur, and in some cases, diffraction and the like may occur, and accordingly, the visibility of the image on the other side of the display apparatus 1A may decrease. In particular, in a case where the strips extend mainly in the x direction and the y direction as in the illustrated example, a cross-shaped diffraction image (referred to as a cross diffraction image) extending in the x direction and the y direction is likely to appear. For this problem, the width of each strip is reduced to alleviate or prevent the diffraction phenomenon that could occur due to light from the back surface side of the transparent display apparatus, and accordingly, the visibility of the image on the back surface side can be further improved. From the viewpoint of alleviating the diffraction, the width of each strip is preferably 50 μm or less, more preferably 10 μm or less, and still more preferably 5 µm or less. The light from the back surface side of the transparent display apparatus described above is light emitted from a light source that is different from the light emitting unit included in the transparent display apparatus.

The width of the strip included in the strip unit 30A is preferably 0.5 µm or more. When the width of the strip is set to 0.5 µm or more, the strip resistance is prevented from excessively increasing, and accordingly, a voltage drop of a power supply and reduction in a signal strength can be prevented.

The electrical resistivity of a line constituting the strip unit 30A is preferably $1.0 \times 10^{-6}$ Ωm or less and more preferably $2.0 \times 10^{-8}$ Ωm or less. A thermal conductivity of a line constituting the strip unit 30A is preferably 150 to 250 W/(m·K) and more preferably 350 to 450 W/(m·K).

In the strip unit 30A, an interval between adjacent strips (including an interval between strips having different functions) may be 5 to 3000 µm, and is preferably 10 to 2000 µm and more preferably 100 to 1000 µm. An interval between adjacent strips in at least one of the x direction and the y direction may be 5 to 3000 µm, and is preferably 10 to 2000 µm and more preferably 100 to 1000 µm. An interval between strips having the same function (for example, an interval between power supply lines) may be preferably 150 to 3000 µm and more preferably 300 to 1000 µm.

When the lines are dense, or when there is an area where the lines are dense, the image on the back surface side may be obstructed from being visually recognized. Therefore, when the interval between adjacent lines is set to 5 µm or more, such an obstruction of visual recognition can be alleviated. However, when the width of the strip is as small as 5 µm or less, and when the transparency of the display apparatus can be secured, the space between the strips may be shielded by a black matrix or the like, so that the space is made into a size equal to or less than the wavelength of the light. When the interval between adjacent lines is set to 3000 µm or less, a strip for securing a sufficient display performance can be constituted.

When the interval between lines of the strip unit 30A is set to 100 µm or more in at least one of the x direction and the y direction, reduction in the visibility due to irregular reflection, diffraction, or the like can be prevented.

The interval between adjacent strips explained above may be the maximum value of intervals between adjacent strips in a case where the intervals between strips are not constant, e.g., strips are curved or strips are not arranged in parallel. In this case, a strip extending past multiple pixels is preferably adopted as a reference strip.

In the illustrated embodiment, the strip unit 30A is configured to include strips extending mainly in the y direction at substantially regular intervals in a front view (a plan view), but the configuration of the strip unit 30A is not limited to the configuration illustrated in the drawing. For example, in the strip unit 30A, power supply lines 31b may be mesh-shaped strips extending past multiple pixels in both of the x direction and the y direction. In this case, the resistance of the power supply lines is reduced, and the size of area that can be made can be increased. Also, the number of substantially parallel strips constituting the mesh is preferably three or more because both a low resistance and an improved transmittance can be achieved at the same time.

In the illustrated embodiment, the data lines 31a extending past multiple pixels are arranged only in the y direction, but data lines extending past multiple pixels may be arranged in both of the x direction and the y direction. Such a configuration is preferable from the viewpoint of increasing the size of area of the panel.

Figure 3:
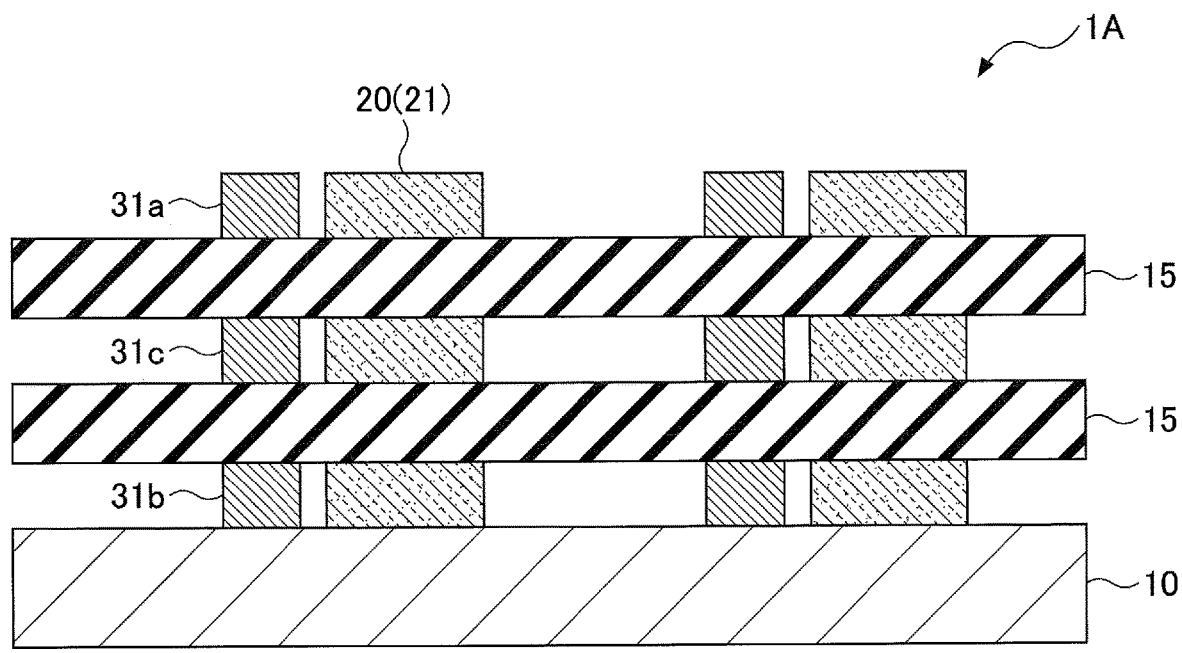
FIG. 3 is a schematic view for explaining a modification of the transparent display apparatus according to the first embodiment.

Further, in the strip unit 30A, at least two of the data line 31a, the power supply line 31b, and the ground line 31c may be arranged to be stacked in the thickness direction. For example, as illustrated in a schematic cross sectional view in FIG. 3, power supply lines 31b and ground lines 31c may be stacked under data lines 31a. In this case, some strips may be embedded in the transparent substrate 10, or an insulating layer 15 may be laminated between the strips, so that the data lines 31a, the power supply lines 31b, and the ground lines 31c are not in contact with each other.

The size of area occupied by a strip unit in an area of a single pixel may be 30% or less, and is preferably 10% or less, more preferably 5% or less, and still more preferably 3% or less, with respect to the size of area of the single pixel. The size of area occupied by the strip unit in the entire display area may be 30% or less, and is preferably 10% or less, more preferably 5% or less, and still more preferably 3% or less, with respect to the size of area of the display area.

The translucency of the strip unit 30A, which is an aggregate of linear-shaped bodies, is relatively low, and its transmittance may be, for example, 20% or less, or 10% or less. Therefore, when the size of area occupied by a strip unit in an area of a single pixel is set to 30% or less and the size of area occupied by a strip unit in the display area is set to 30% or less, the area where the strip unit 30A blocks transmission of light can be reduced, and an area of a low transmittance (for example, an area of which the transmittance is 20% or less) in the display area can be reduced. Also, when the size of area occupied by the strip unit 30A in the display area is set to 20% or less, an area of a high transmittance increases, and accordingly, the transparency of the display apparatus can be improved, and the visibility of the image on the back surface side can be improved.

Furthermore, the size of area occupied by the light emitting unit 20 and the strip unit 30A in each pixel (i.e., in an area of a single pixel) is preferably 30% or less, more preferably 20% or less, and still more preferably 10% or less, with respect to the size of area of the single pixel. The size of area occupied by the light emitting units 20 and the strip unit 30A is preferably 30% or less, more preferably 20% or less, and still more preferably 10% or less, with respect to the size of area of the display area.

The transparent substrate 10 is not particularly limited as long as it has an insulating property and is transparent, but the transparent substrate 10 preferably includes a substrate containing resin, and preferably a substrate mainly made of resin. Examples of resins used as the transparent substrate include: polyester resins such as polyethylene terephthalate (PET) and polyethylene naphthalate (PEN); olefin resins such as cycloolefin polymer (COP) and cycloolefin copolymer (COC); cellulosic resins such as cellulose, acetyl cellulose, and triacetyl cellulose (TAC); imide-based resins such as polyimide (PI); and the like. Also, thin glass, for example, glass of 200 µm or less, preferably 100 µm or less, may be used as the transparent substrate 10.

Among the materials used for the transparent substrate, polyethylene naphthalate (PEN) and polyimide (PI) are preferable from the viewpoint of improving heat resistance. In addition, cycloolefin polymer (COP), cycloolefin copolymer (COC), and the like are preferable as having a low birefringence and capable of reducing distortion and blurring of images seen through a transparent substrate.

The above-mentioned materials can be used alone or two or more of the materials may be used in combination, i.e., in a form in which different materials are mixed, or planar substrates made of different materials may be used as being stacked. The thickness of the entire transparent substrate 10 is preferably 3 μm to 1000 μm and more preferably 5 μm to 200 μm. The internal transmittance of visible light of the transparent substrate 10 is preferably 50% or more, more preferably 70% or more, and still more preferably 90% or more.

Also, the transparent substrate 10 preferably has flexibility. In this case, for example, in a case where the transparent display apparatus 1A is attached to a curved plate-like body or is used as being laminated between two curved plate-like bodies, the transparent display apparatus 1A can be easily formed according to the curve of the plate-like bodies. Also, a material exhibiting shrinkage when heated to 100 degrees Celsius or more is still more preferable.

Figure 4:
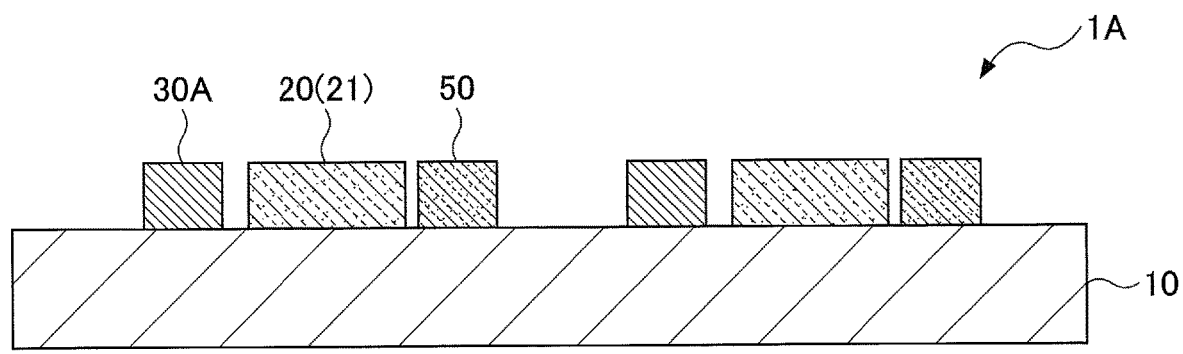
FIG. 4 is a schematic view for explaining a modification of the transparent display apparatus according to the first embodiment.
Figure 5:
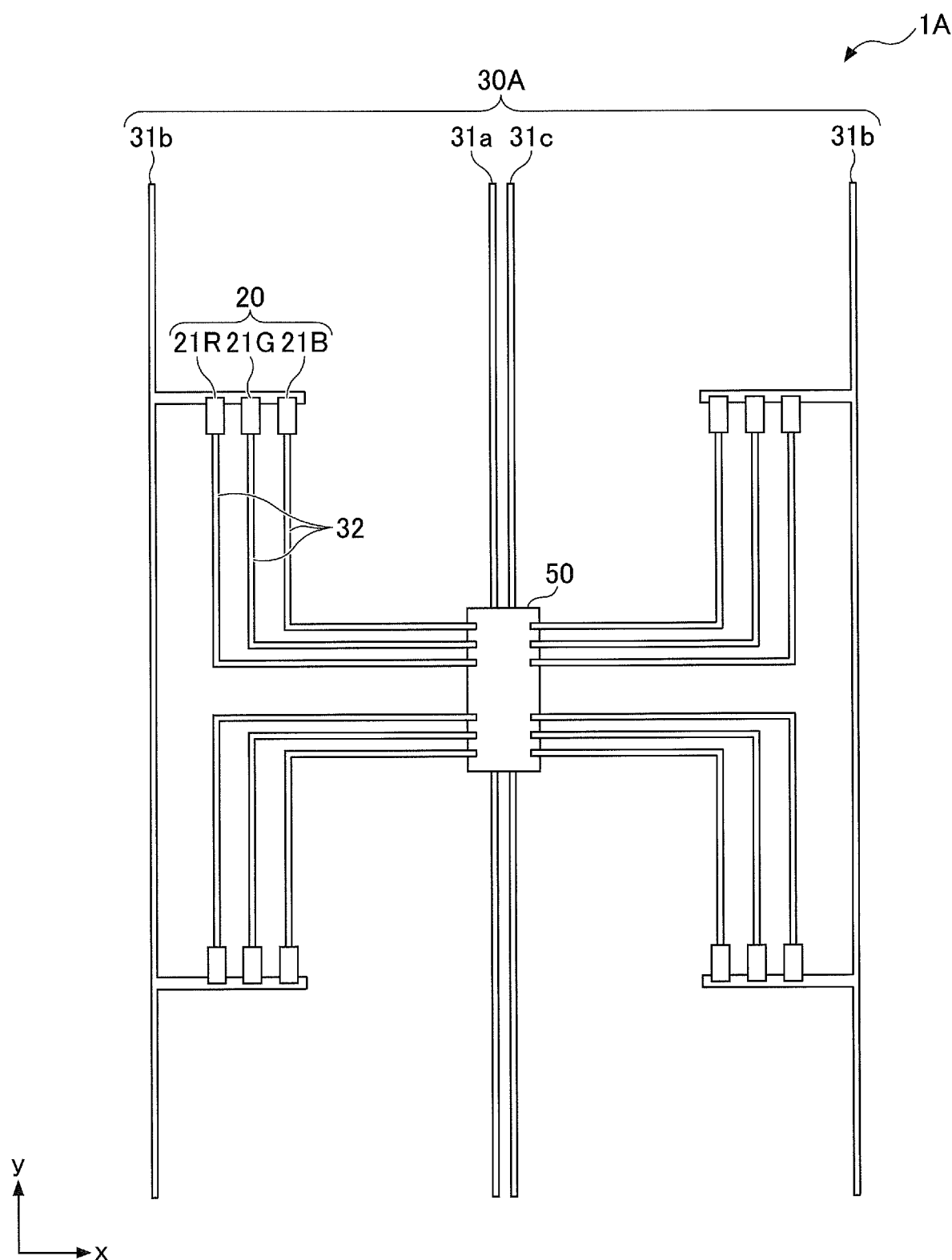
FIG. 5 is a schematic view for explaining a modification of the transparent display apparatus according to the first embodiment.

As illustrated in FIG. 2, the transparent display apparatus 1A may further include a driving IC chip 50 connected to the light emitting unit 20. FIG. 4 schematically illustrates a basic configuration in a form having the driving IC chip 50. As illustrated in FIG. 2, each of the IC chips 50 can be arranged in association with a pixel, i.e., for a pixel (i.e., for a light emitting unit 20) to drive the pixel. Alternatively, each of the IC chips 50 can be arranged in association with multiple pixels, i.e., for multiple pixels (i.e., for multiple light emitting units 20) to drive the multiple pixels. FIG. 5 illustrates a schematic plan view of an aspect in which an IC chip is arranged for multiple pixels. In the example of FIG. 5, a single IC chip is configured to drive light emitting units of four pixels.

The IC chip 50 may be arranged on the transparent substrate 10, but a pad made of copper or silver may be arranged on the transparent substrate 10, and the IC chip may be arranged on the pad. The LEDs 21 explained above may also be arranged on the pad. The size of area occupied by the pad can be set to about 300 to 2000 $\mu m^2$.

As the IC chip 50, a hybrid IC including an analog part and a logic part may be used. The size of area of the IC chip may be 100,000 $\mu m^2$ or less, preferably 10,000 $\mu m^2$ or less, and more preferably 5,000 $\mu m^2$ or less. The analog part of the IC chip may include a buck-boost circuit and the like in addition to a circuit for controlling the amount of current. The transparency of the IC chip itself is low, and its transmittance is about 20% or less, and therefore, the use of the IC chip of the above size can contribute to reduction of an area where the IC chip blocks transmission of light and reduction of an area of a low transmittance (for example, an area of which the transmittance is 20% or less) in the display area. When an IC chip 50 of which the size of area is 20,000 $\mu m^2$ or less is used, an area of a high transmittance increases, and therefore, the transparency of the display apparatus can be improved, and the visibility of the image on the back surface side can be improved.

In the above-described configuration (FIG. 5) in which the single IC chip is arranged for multiple pixels, a fewer number of IC chips are arranged in the display area, and the total size of area occupied by the IC chips becomes smaller. Therefore, the transmittance of the display apparatus can be improved.

In the present embodiment, an IC chip-attached LED in which an LED and an IC chip are packaged together can also be used. Further, the IC chip may be replaced with a circuit including a thin film transistor (TFT).

In a case where the transparent display apparatus 1A includes the IC chips 50, the size of area occupied by the light emitting unit 20, the strip unit 30A, and the IC chip 50 in each pixel (in an area of a single pixel) is preferably 30% or less, more preferably 20% or less more, and still more preferably 10% or less, with respect to the size of area of the single pixel. The size of area occupied by the light emitting units 20, the strip unit 30A, and the IC chips 50 is preferably 30% or less, preferably 20% or less more, and still more preferably 10% or less, with respect to the entire size of area of the display area.

Further, in the present embodiment, a low transmittance area may be unevenly distributed in an area of a single pixel. For example, in an area of a single pixel, strips of the strip unit may be arranged closely to each other, or a light emitting unit and an IC chip may be arranged closely to strips. In this case, a high transmittance area extending to a certain extent in the x direction and the y direction can be formed. For example, an area of a single pixel does not have to include a low transmittance area, for example, an area of which the transmittance is 20% or less. When a low transmittance area is unevenly distributed in a single pixel area, the diffraction of light from the back surface side can be further more suppressed.

In the present embodiment, according to the above configuration, a low transmittance area in each pixel, for example, an area of which the transmittance is 20% or less can be reduced to 30% or less, preferably 20% or less, and more preferably 10% or less. An area of which the transmittance is 20% or less can be reduced to 30% or less, preferably 20% or less, and more preferably 10% or less, with respect to the entire display area. In this case, a visible light transmittance of 70% or more can be readily obtained in each pixel, and preferably a transmittance of 80% or more, more preferably a transmittance of 90% or more, can be readily obtained. In addition, a visible light transmittance of 70% or more can be obtained in the entire display area, and preferably a transmittance of 80% or more, more preferably a transmittance of 90% or more, can be readily obtained.

Figure 6:
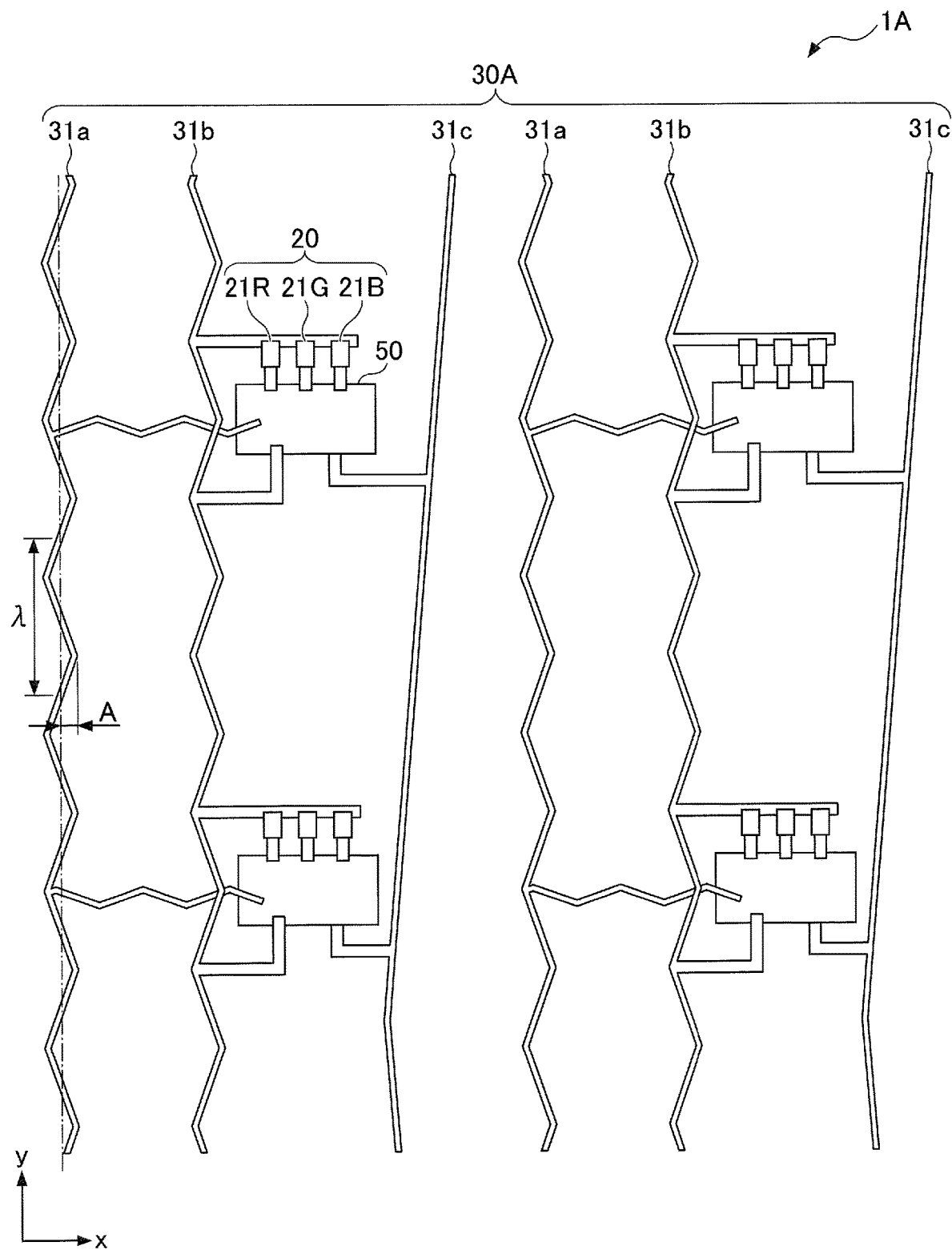
FIG. 6 is a schematic view for explaining a modification of the transparent display apparatus according to the first embodiment.
Figure 7:
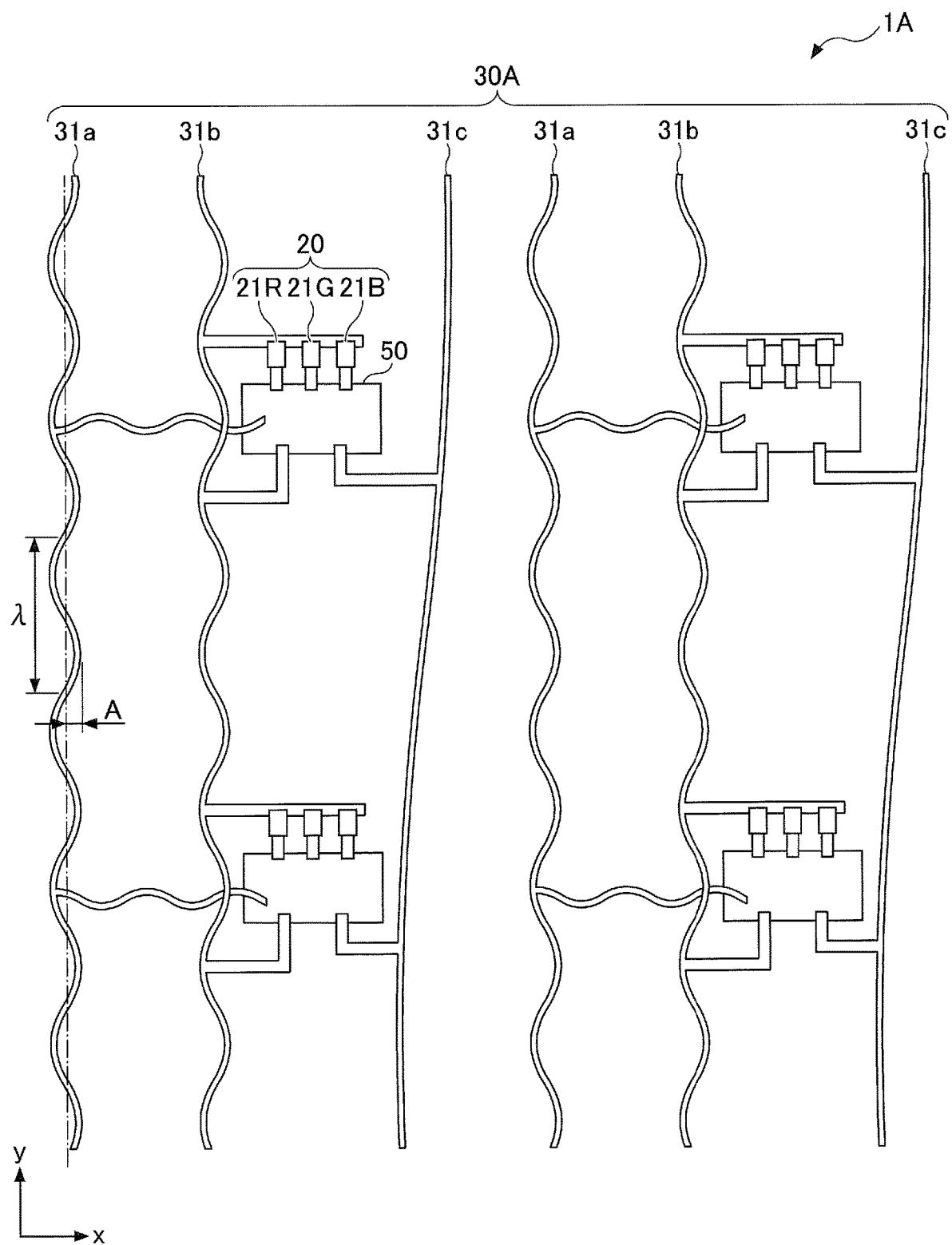
FIG. 7 is a schematic view for explaining a modification of the transparent display apparatus according to the first embodiment.
Figure 8:
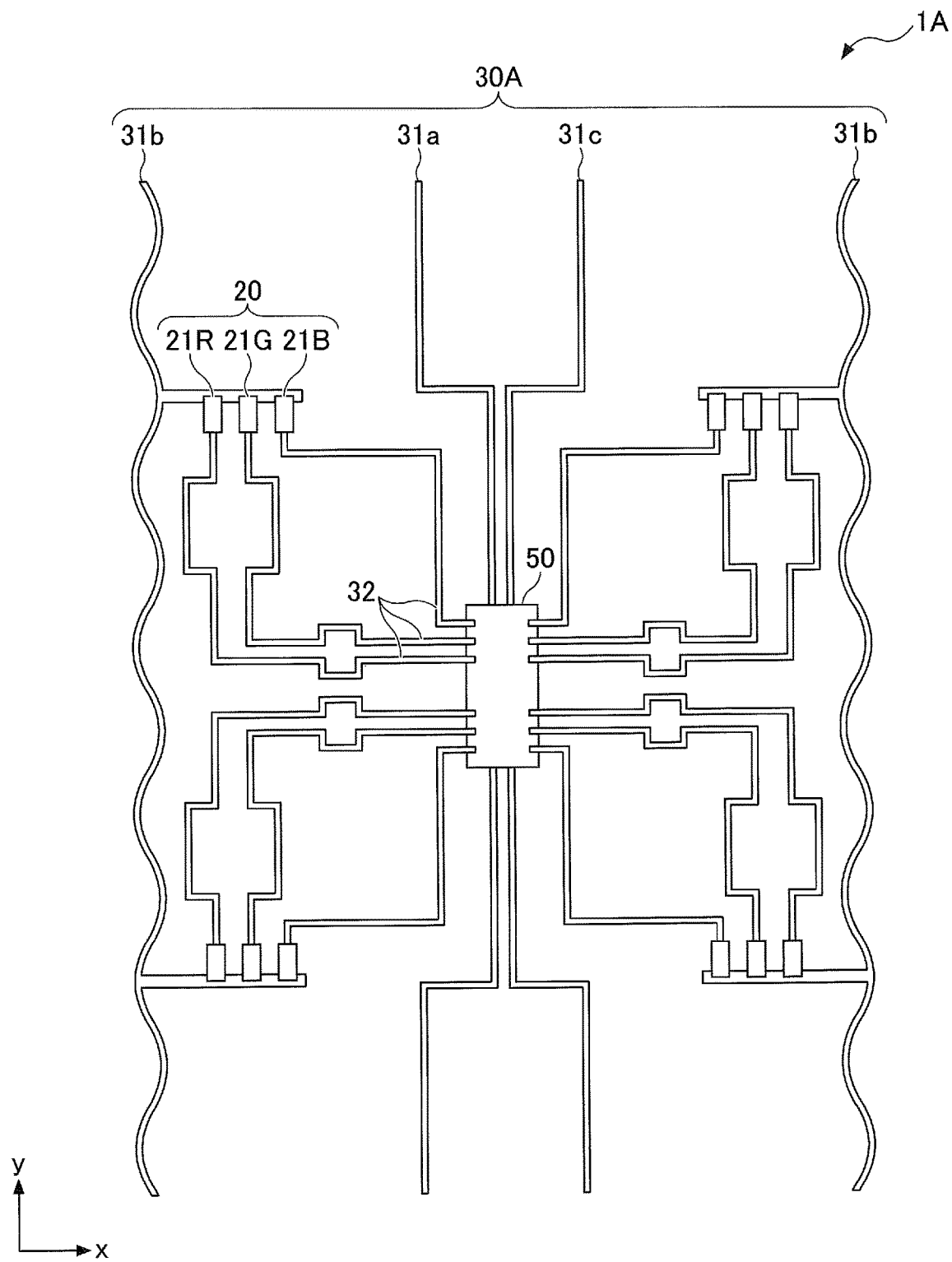
FIG. 8 is a schematic view for explaining a modification of the transparent display apparatus according to the first embodiment.

FIG. 6 to FIG. 8 illustrate other examples of the present embodiment. The examples illustrated in FIG. 6 and FIG. 7 have configurations similar to the transparent display apparatus 1A illustrated in FIG. 2, but the examples illustrated in FIG. 6 and FIG. 7 are different in that the strips (data lines 31a, power supply lines 31b, and ground lines 31c) of the strip unit 30A are arranged so that tangential line directions of the strips change. In the present specification, the tangential line direction of a strip may be a tangential line direction of a center line extending in an extension direction of the strip. As illustrated in FIG. 6 and FIG. 7, the strips may be arranged to have a bent portion or a curved portion, or both of the bent portion and the curved portion. In a plan view, the strips may be in a wave shape in which an uneven pattern are repeated in a predetermined direction.

In the example of FIG. 6, the data lines 31a and the power supply lines 31b have multiple bent portions, and extend in the y direction with a shape in which the uneven pattern in the x direction are repeated. In other words, both of the strips are arranged in a zigzag pattern (triangular wave shape). In the illustrated example, the above strips have an arrangement in which the uneven pattern in the x direction having a predetermined amplitude A are repeated with a predetermined wavelength λ. In the present specification, the wavelength λ indicates the length of a single waveform (in units of μm and the like), and may be referred to as a cycle, a length of cycle, a pitch, and the like.

In contrast, in the example of FIG. 7, the data lines 31a and the power supply lines 31b include curved portions, and the ground lines 31c include gentle curved portions. In other words, these strips are in a curved wave shape, and more specifically in a shape of sine waves. In the example of FIG. 7, the strips have no corners as in the example of FIG. 6, and are arranged so as to include differentiable curved portions in a plan view. In other words, the strips are arranged so that the tangential line directions of the strips change continuously. The shapes of such curved lines can be, for example, sine curves and the like. Also in the example of FIG. 7, the strips are arranged so that the uneven pattern in the x direction having a predetermined amplitude A are repeated with a predetermined wavelength A.

In this manner, the strips are in a zigzag shape or a curved wave shape (FIG. 6 to FIG. 8), which can effectively reduce diffraction of light from a light source at the back surface side by the display apparatus. This is considered to be because of the reason that straight portions of the strips can be reduced or eliminated, so that a diffraction phenomenon is prevented from occurring continuously in a predetermined single direction, and the positions where the diffraction phenomenon occurs are dispersed.

In a case where the strips are in a wave shape in a plan view, the strips may be not only in the shapes as illustrated in FIG. 6 and FIG. 7 but also in a curved wave shape other than the sine wave, or also in a shape of square wave, sawtooth wave, or the like.

It should be noted that the strips in the curved line shapes tend to appear blurred and are less likely to be visually recognized by human eyes than strips in a straight line shape. Therefore, as the straight portions decrease and the curved portions increase in the strips, the transparency can be improved in a sensory manner. Therefore, in the configuration having the strips arranged in a curved wave shape as illustrated in FIG. 7, the transparency can be improved while the diffraction is reduced, and as a result, the visibility of the image on the back surface side can be efficiently improved.

Furthermore, the strip unit is arranged to have the bent portions, the curved portions, or both of the bent portions and the curved portions, so that the haze of the display area can also be reduced, as compared with strips in a straight line shape of which the tangential line directions do not change. This is considered to be because, even though the length of the strips become long, the angle of the diffracted light decreases, and also the diffracted light strength decreases. The haze value of the display area is, for example, 10% or less, preferably 3% or less, and more preferably 1.0% or less.

In a case where the strips are in a wave shape in a plan view, the amplitude A may be 1 to 500 μm, and is preferably 2.5 to 180 μm and still more preferably 5 to 60 μm. The wavelength $\lambda$ may be 1000 μm or less, and is preferably 50 to 600 μm and still more preferably 100 to 400 μm. When the amplitude A and the wavelength $\lambda$ are set to the above ranges, the diffraction phenomenon of light from the back surface side is alleviated, and the haze is reduced, and in addition, an increase in the electric resistance of strips due to excessively long strips can be prevented.

Furthermore, the value of the ratio (A/$\lambda$) of the amplitude A to the wavelength $\lambda$ may be 0.005 to 0.5, and is preferably 0.05 to 0.3 and more preferably 0.05 to 0.15. When the value of the ratio of the amplitude A to the wavelength $\lambda$ is set to 0.005 or more, the diffraction phenomenon of light can be effectively alleviated, and when the value of the ratio of the amplitude A to the wavelength $\lambda$ is set to 1 or less, the lengths of strips can be prevented from being excessively long.

In the example of FIG. 6 and FIG. 7, the amplitude A and the wavelength $\lambda$ of the strips are constant, but at least one of the amplitude A and the wavelength $\lambda$ may vary within a single strip. In a case where at least one of the amplitude A and the wavelength $\lambda$ varies, the amplitude A or the wavelength $\lambda$ of a predetermined strip may be an average value of the amplitude A or the wavelength $\lambda$ of the predetermined strip in a single pixel.

In adjacent strips extending in the same direction, at least one of the amplitude A, the wavelength $\lambda$, and the phase may be the same, or all of the amplitude A, the wavelength $\lambda$, and the phase may be different. For example, in FIG. 7, the data line 31a and the power supply line 31b are adjacent strips extending in the same direction, i.e., the y direction, except branching portions for connection with the light emitting units 20 and the IC chips 50. The data line 31a and the power supply line 31b have substantially the same amplitude A and the same wavelength $\lambda$ as each other, but have different phases with respect to the uneven pattern (waveforms).

In this case, in adjacent strips extending in the same direction, at least one of the amplitude A and the wavelength $\lambda$ is changed, and more particularly, the wavelength $\lambda$ is changed, so that the effect of alleviating the diffraction phenomenon of light from the back surface side and reduction of the haze can be further improved. In addition, since the phases of adjacent strips extending in the same direction are different from each other, the effect of reducing crosstalk can also be obtained.

Also, when, in a single pixel, a single strip in the pixel has at least one bent portion or curved portion, the effect of alleviating diffraction and reducing the haze value described above can be obtained. However, the number (the total number) of bent portions and curved portions of at least one strip in a single pixel is preferably 3 or more, more preferably 10 or more, and still more preferably 30 or more, excluding the branching portion for connection with the light emitting unit 20 or the IC chip 50.

The example of FIG. 8 has a configuration similar to the transparent display apparatus 1A as illustrated in FIG. 5, but power supply lines 31b in the strip unit 30A are arranged in a curved wave shape, and data lines 31a and ground lines 31c are arranged to be bent so as to have corners. The strips 32 connecting the light emitting units 20 and the IC chip 50 are also arranged to be bent at two or more portions. Like the example as illustrated in FIG. 6 and FIG. 7, the example of FIG. 8 also reduces portions in a straight line shape (i.e., portions extending in a straight line shape in a certain direction) in the strip unit 30A, so that a greater effect of alleviating the diffraction phenomenon of light from the back surface side and reducing the haze can be obtained.

As in the above example, in a case where the strip unit 30A has strips arranged in such a manner that their tangential line directions change in a plan view, the length of the straight portion of the strip is preferably 500 μm or less and more preferably 100 μm or less. When the length of the straight portion of the strip is set to 300 μm or less, the strip appears blurred and is less likely to be visually recognized when the strip is seen with human eyes. Therefore, the transparency can be improved in a sensory manner. The length of the straight portion of the strip is preferably 2 μm or more, in view of various manufacturing conditions. The strips preferably do not have any straight portion, i.e., the entire strips are preferably in a curved line shape.

Also, the strips are arranged in such a manner that their tangential line directions change, and therefore, even in a case where the display apparatus 1A according to the present embodiment is used as being attached to a plate-like body having a curved surface, for example, a plate-like body (a glass plate and the like) bent in two directions orthogonal to each other, or even in a case where the display apparatus 1A according to the present embodiment is used as being sealed between two such plate-like bodies, stress applied to the strips can be alleviated, and therefore, the strips can be prevented from being damaged.

Further, the strip 31 may be arranged in a linear manner in a plan view or arranged in such a manner that tangential line directions change, and may have a strip main body 311 and a side edge portion formed along the strip main body on all or a part of at least one of side edges of the strip 31. In FIG. 18A, a high transmittance edge portion 312 having a higher transmittance than the transmittance of the strip main body 311 is provided. Also, the high transmittance edge portion may be a transmittance change portion of which the transmittance increases gradually or stepwise toward the outer side. In a case where the transmittance of the high transmittance edge portion increases stepwise toward the outer side, 2 to 5 areas of which the transmittances are different are preferably provided in the high transmittance edge portion. For example, in a case where the strip 31 is formed to have a transmittance of 0%, the high transmittance edge portion may be configured to include an area having a transmittance of 50% and an area having a transmittance of 75%. The width of the high transmittance edge portion may be about 0.1 to 5 μm, and may be about 5 to 30% of the width of the strip main body.

In this manner, the strip 31 includes high transmittance edge portions on all or a part of at least one of side edges, so that the diffraction angle of the light changes. Therefore, diffracted light of light from a light source, reflected light from the transparent substrate, light propagating inside the transparent substrate, and the like are reduced, and transparency and stray light resistance can be enhanced, so that a transparent display apparatus in which the diffraction phenomenon is alleviated can be obtained.

The above-described high transmittance edge portions can be formed by arranging an edge portion made of a high transmittance material on side edges of the strip 31 so as to frame the side edges. Alternatively, the above-described high transmittance edge portion can also be formed by stacking, under the strip 31, a high transmittance material wider than the strip width or coating the strip 31 with a coating material having a relatively high transmittance. Also, when the strip 31 is formed, the thickness of all or parts of the side edges may be reduced to make it a high transmittance edge portion, or after the strip 31 is formed with a uniform material and thickness, very small holes may be formed in the portion desired to be made into the high transmittance edge portion. Also, the edge portion of the high transmission edge portion may be darkened, and the dark color may become lighter toward the outer side. Further, the above-mentioned configuration of the high transmittance edge portion may be formed stepwise so as to include a part of the strip main body 311.

Regardless of whether the strip 31 is arranged in a linear manner in a plan view or arranged in such a manner that tangential line directions change, the strip 31 may have the uneven pattern on all or a part of at least one of the side edge portions of the strip 31. The size of a protruding portion protruding from the side edge portion of the strip depends on the configuration such as the width of the strip, but the protruding portion may protrude by a width of about 5 to 30% of the strip width in a plan view. Further, the apex of the shape of the protruding portion in the plan view may be sharp, rounded, or flat. In other words, the shape of the protruding portion in the plan view is not particularly limited, and may be one or more of a polygon such as a triangle or a quadrangle, a circle, an ellipse, and a part thereof. For example, substantially semicircular protruding portions can be provided on the edge portions of the strip. In this case, the uneven pattern may be formed irregularly by providing two or more substantially semicircular protruding portions having different radiuses.

Such an unevenness is very small, and can be formed by roughening the periphery of the strip or the edge portion as seen in the plan view by etching or the like. Alternatively, such an uneven pattern may be famed by attaching fine particles and the like to the periphery of the strip or the edge portion as seen in the plan view.

In this manner, even when the strip has the same size of occupied area and the same transmittance, the diffraction phenomenon can be reduced by providing a fine uneven pattern in the side edge portion of the strip. Therefore, the diffraction phenomenon can be reduced while the transmittance of the entire display apparatus is secured. Although an uneven pattern can be provided regularly so that the contour lines of the side edges become, for example, a waveform, the diffraction phenomenon can be more greatly reduced when unevenness are arranged in an irregular manner.

The configurations of the strips 30A explained above can be used in combination. For example, the uneven pattern may be provided in the high transmittance edge portion explained above, or the high transmittance edge portions and the uneven pattern may be arranged alternately on the side edges of the strips 31. Also, the high transmittance edge portions and/or the uneven pattern may be provided in constituent elements other than the strips, and for example, may be provided in edge portions of the pad on which the LEDs and the IC chip are placed.

Further, in order to reduce the diffracted light, the strips 30A are preferably arranged such that, in a single pixel, a ratio of the number of strips extending substantially parallel to a certain direction to the number of strips extending substantially parallel to a direction orthogonal to the certain direction becomes approximately 1:1. Here, "extending substantially parallel to a certain direction" does not mean extending completely parallel to the certain direction, and may include a state in which strips extend within a range of ±10 degrees and preferably within a range of ±5 degrees with respect to the certain direction.

For example, in the present embodiment, strips can be arranged in such a manner that, within a pixel, the value of the ratio (Nx/Ny) of the number (Nx) of strips extending in the row direction (x direction) to the number (Ny) of strips extending in the column direction (y direction) becomes close to 1:1. The value of the ratio (Nx/Ny) of the number (Nx) of strips extending in the row direction (x direction) divided by the number (Ny) of strips extending in the column direction (y direction) preferably ranges from 0.25 to 4, more preferably 0.33 to 3, still more preferably 0.5 to 2, and is still even more preferably 1. In a case where the arrangement of the strips is different depending on the position in the pixel, the value of the above ratio may be an average value. Such a diffracted light reduction effect achieved by adjusting the ratio of the numbers of strips in the pixel is particularly high in a case where the strips are arranged in a wave shape.

Figure 9:
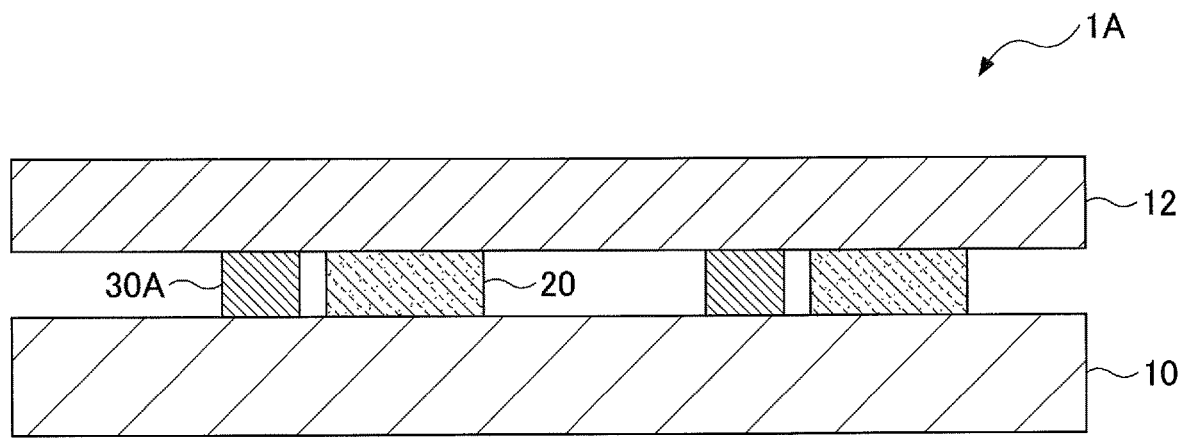
FIG. 9 is a schematic view for explaining a modification of the transparent display apparatus according to the first embodiment.

The transparent display apparatus 1A has a configuration in which constituent elements such as the light emitting units 20, the strip unit 30A, and the like are arranged on the transparent substrate 10, but the transparent display apparatus 1A may be configured such that constituent elements such as the light emitting units 20, the strip unit 30A, and the like are laminated between two transparent substrates. In other words, as schematically illustrated in FIG. 9, the light emitting units 20 and the strip unit 30A may be arranged on a first transparent substrate 10, and a second transparent substrate 12 may be arranged thereon. That is, the transparent display apparatus 1A can be configured such that at least the light emitting units 20 are laminated between the first transparent substrate 10 and the second transparent substrate 12. As a result, the constituent elements such as LEDs, IC chips, and strips can be sealed and protected between the two transparent substrates 10, 12.

The material, thickness, and the like of the second transparent substrate 12 are similar to those described above with regard to the first transparent substrate 10. Further, the first transparent substrate 10 and the second transparent substrate 12 may be the same or different in terms of the material, thickness, and the like.

The size of area of the display area of the transparent display apparatus 1A may be $1\times10^4$ to $2\times10^6$ mm$^2$ or may be $3\times10^4$ to $1\times10^6$ mm$^2$. The size of area of the display area of the transparent display apparatus 1A may be 1 to 90% or 5% to 75% of the size of area of the front surface of the transparent display apparatus 1A. The shape of the display area may be a rectangular shape, a square shape, a shape similar to the external shape of the display apparatus 1A, and a shape of which the horizontal direction is longer relative to the vertical direction as compared with the external shape of the display apparatus 1A. Further, the present embodiment can be preferably used for applications where the visual recognition distance (distance from the observer to the display screen) is relatively short, and for example, applications where the visual recognition distance is 0.2 to 3.0 m. In this manner, even in applications where the visual recognition distance is relatively short, the very small LEDs are used and the a low transmittance area is provided at a predetermined ratio, so that the transparency can be improved, and the visibility of images seen through the display apparatus can be improved.

In the illustrated embodiment, although the strip unit 30A is arranged on the transparent substrate 10, the strip unit 30 or a part of the strip unit 30 may be embedded in the transparent substrate 10. In the illustrated embodiment, the strip unit 30A is arranged in a two-dimensional and regular manner, i.e., arranged in such a manner that each pixel has the same configuration, but the strip unit 30A may be arranged in an irregular manner. For example, the configuration of the strip unit 30A in each pixel can be changed by partially changing the width, interval, the order of arrangement, the material, and the like of the lines.

The transparent display apparatus 1A according to the first embodiment can be produced by preparing the transparent substrate 10, forming the strip unit 30A on the transparent substrate 10, and arranging the light emitting units 20. In a case where the transparent display apparatus 1A having the IC chips 50 is produced, the IC chips 50 can be also placed during the process of placing the light emitting units 20 (the LEDs 21). The formation of the strip unit 30A, the arrangement of the light emitting units 20, and the arrangement of the IC chips 50 can be pertained by using a known mounting technique. For example, a method using solder balls, transfer printing, and the like can be used.

Second Embodiment

Figure 10:
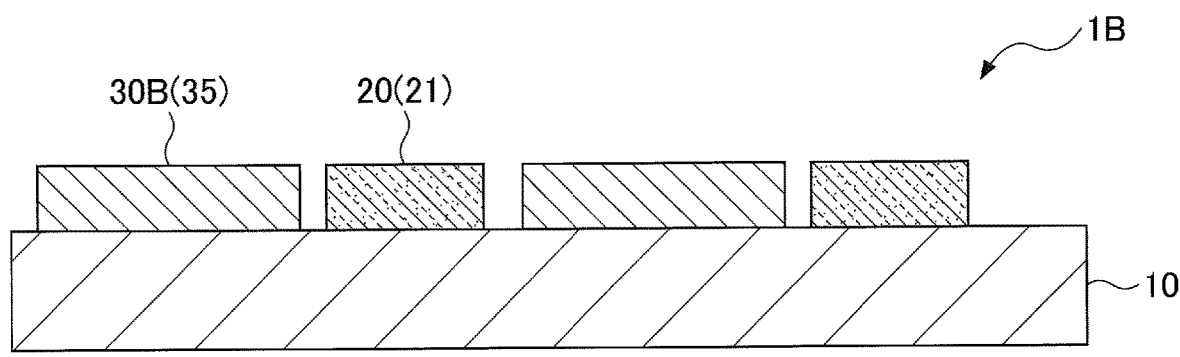
FIG. 10 is a schematic cross sectional view for explaining a basic configuration of a transparent display apparatus according to a second embodiment.

FIG. 10 illustrates a drawing for explaining a basic structure of a transparent display apparatus 1B according to the second embodiment of the present invention. FIG. 10 is the schematic cross sectional view of the transparent display apparatus 1B. As illustrated in FIG. 10, the transparent display apparatus 1B may include a transparent substrate 10, a light emitting unit 20 arranged on a principal surface of the transparent substrate 10, and a strip unit 30B also arranged on the principal surface of the transparent substrate 10.

The basic configuration of the second embodiment can be the same as that of the first embodiment. However, the second embodiment is different from the first embodiment in that at least a part of the strip unit uses the strip unit 30B in which a belt-shaped transparent conductive film 35 is used. In the second embodiment, the transparency of the display area can be improved by including the transparent conductive film 35 in the strip unit 30B.

Since the transparent conductive film 35 itself has a high transparency, the transparent conductive film 35 is unnoticeable. However, the edge portion of the transparent conductive film 35 is more likely to be visually recognized than the central portion. Therefore, the edge portion may become likely to be visually recognized and may hinder transparency, when the edge portions of the transparent conductive film 35 come into proximity with each other in a case where the width of the transparent conductive film 35 is narrow or the transparent conductive films 35 are arranged side by side.

In addition, when light is emitted from the outside, irregular reflection occurs at the edge portions of the transparent conductive film 35, and in some cases, diffraction and the like may occur, and therefore, the visibility of the image on the other side of the display apparatus may decrease. Furthermore, when the edge portions of the transparent conductive film 35 are too close to each other, migration may occur. For this reason, both edges of the transparent conductive film 35 and the edge portions of multiple adjacent transparent conductive films 35 are preferably not close to each other.

The width of the transparent conductive film 35 is preferably 100 μm to 60000 μm and more preferably 300 to 5000 μm or less in a front view. When the width is 100 μm or more, the strip resistance can be prevented from excessively increasing. When the width of the transparent conductive film 35 is 300 μm or more, the edge portions become less visually recognizable, and the transparency is improved, and in addition, a voltage drop of the power supply and reduction in the signal strength can be prevented. In a case where, multiple transparent conductive films 35 are arranged, an interval between edge portions of adjacent transparent conductive films 35 is preferably 100 μm or more and more preferably 300 μm or more.

In a case where the transparent conductive film 35 is at least a part of the strip unit 30B, the transparent conductive film 35 may be deposited on the transparent substrate 10. Also, it may be deposited on another element on the transparent substrate 10, for example, an insulating layer and a conductive layer. In any case, the thickness of the transparent conductive film 35 can be about 20 to 300 nm. When the film thickness of the transparent conductive film 35 is about 10 to 30 nm, or when a reflection suppression layer is added, a phenomenon where the shape of the transparent conductive film 35 is seen can be alleviated. The reflection suppression layer may be made of: substances having refractive indexes between ITO and resin, such as SiON and alumina; or materials of high and low refractive indexes for multilayer films, such as zirconia, titania, tantala, alumina, SiON, Si3N$_4$, silica, and the like.

Figure 11A:
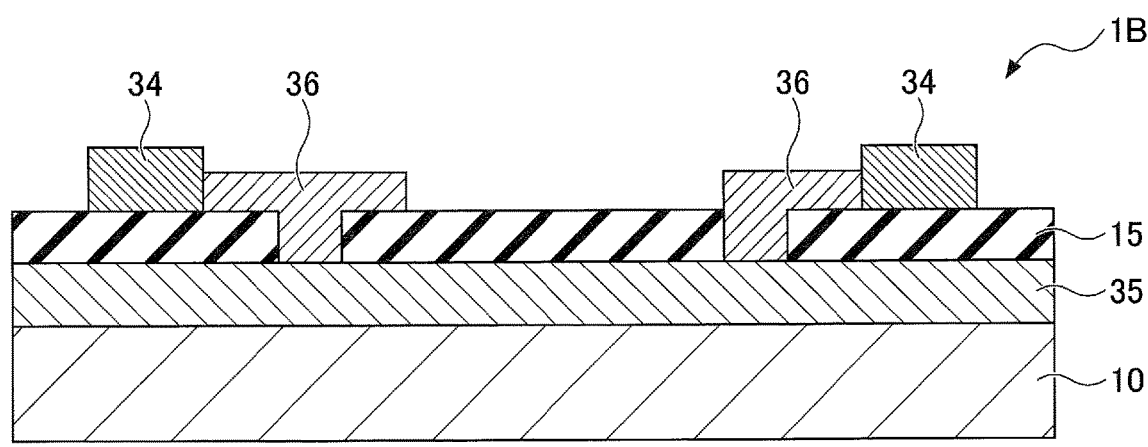
FIG. 11A is a schematic cross sectional view for explaining a configuration of the transparent display apparatus according to the second embodiment.
Figure 11B:
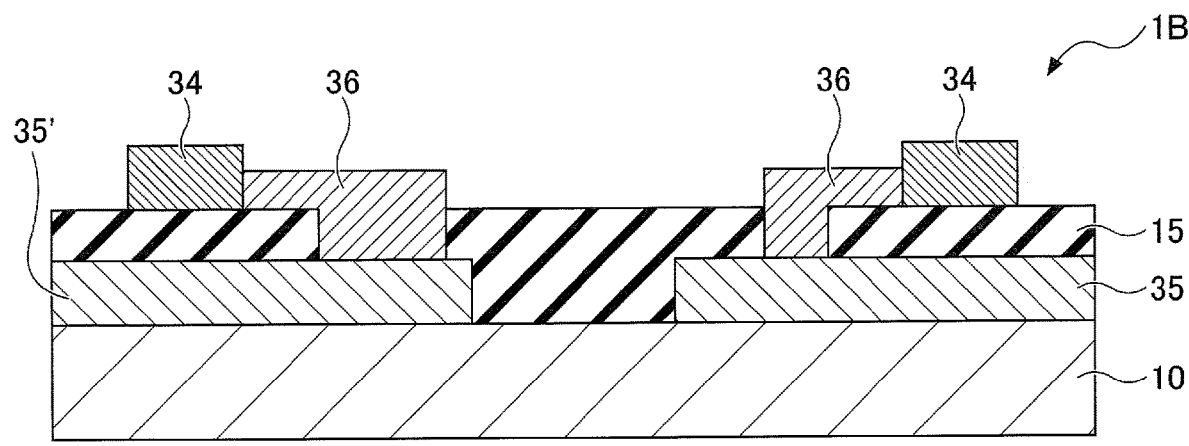
FIG. 11B is a schematic cross sectional view for explaining a configuration of the transparent display apparatus according to the second embodiment.
Figure 11C:
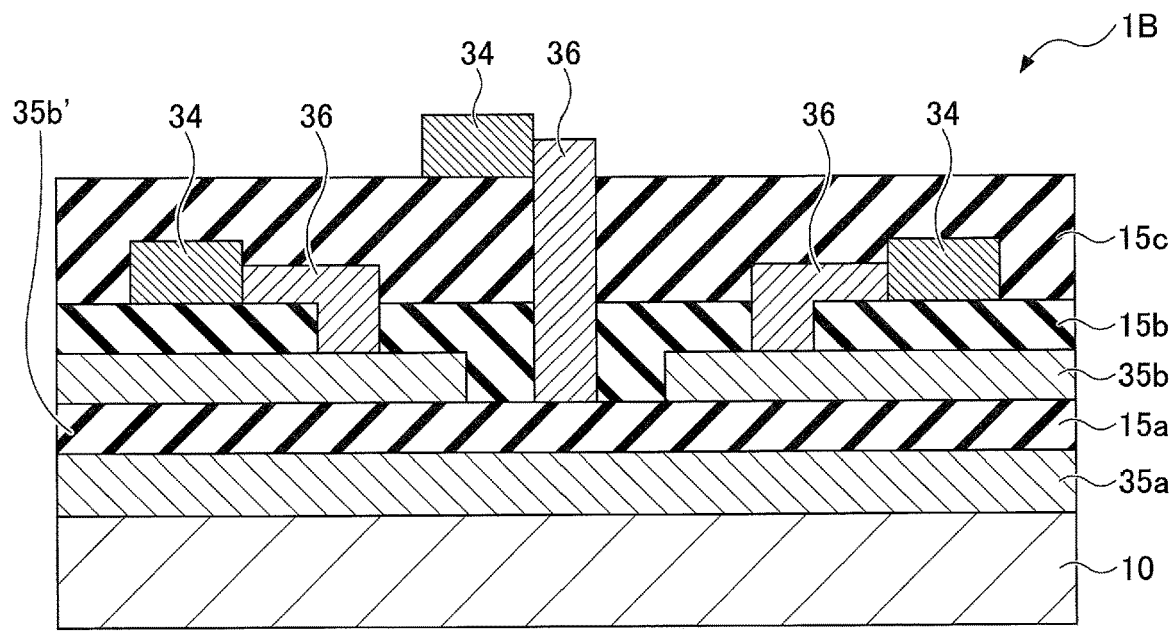
FIG. 11C is a schematic cross sectional view for explaining a configuration of the transparent display apparatus according to the second embodiment.

FIGS. 11A to 11C schematically illustrate a configuration where the transparent conductive film 35 is used as the strip unit of the transparent display apparatus 1B. Each of FIGS. 11A to 11C is a schematic cross sectional view of the transparent display apparatus 1B.

In the example of FIG. 11A, the transparent conductive film 35 is deposited on the entire transparent substrate 10. Another strip 34 is formed above the transparent conductive film 35 with an insulating layer 15 interposed between the another strip 34 and the transparent conductive film 35. The transparent conductive film 35 and the strip 34 may be connected via a conductive layer 36. In a case where the transparent conductive film 35 is deposited on the entire transparent substrate 10, the edge portions of the transparent conductive film 35 are less likely to be visually recognized in the display area. Therefore, the transparent display apparatus 1B can have a high transparency.

The transparent conductive film 35 can also be formed on the transparent substrate 10 as multiple belt-like bodies. For example, as schematically illustrated in FIG. 11B, transparent conductive films 35 and 35' may be arranged at predetermined intervals. When other strips 34 are formed on the transparent conductive film 35 and 35', the strips 34 may be arranged with an insulating layer interposed therebetween as in the example of FIG. 11A.

The transparent conductive film 35 does not have to be constituted by a single layer, and may be arranged as being divided into multiple layers in the thickness direction of the transparent display apparatus 1B. For example, as schematically illustrated in FIG. 11C, a transparent conductive film 35a is deposited on the entire surface of the transparent substrate 10, and the transparent conductive films 35b and 35b' are famed above the transparent conductive film 35a with an insulating layer 15a interposed therebetween. When the transparent conductive film is arranged as being divided into multiple layers, more complicated strips are achieved.

The visible light internal transmittance of the transparent conductive film 35 is preferably 70% or more and more preferably 85% or more. Examples of materials of the transparent conductive film 35 include tin-doped indium oxides (indium tin oxide, ITO), fluorine-doped indium oxide, fluorine-doped tin oxide (FTO), graphene, silver nanostrips, and the like.

The electrical resistivity of the transparent conductive film 35 is preferably $1.0 \times 10^{-3}$ Ωm or less and more preferably $1.0 \times 10^{-1}$ Ωm or less. The thermal conductivity of the transparent conductive film 35 is preferably 5 to 100 W/(m·K) and more preferably 100 to 3000 W/(m·K).

A product of a ratio (%) of the size of area of the transparent conductive film 35 to the size of area of the entire display area and a transmittance (%) of the transparent conductive film 35 is preferably 50 or more and more preferably 70 or more. When the above product is 50 or more and preferably 70 or more, a sufficient transparency can be secured.

Like the first embodiment, in the second embodiment, the transparent display apparatus 1B may have an IC chip for driving LEDs for each pixel. In this case, the size of area occupied by the light emitting units 20 and the IC chip 50 in each pixel (i.e., in an area of a single pixel) is preferably 30% or less, more preferably 20% or less more, and still more preferably 10% or less, with respect to the size of area of the single pixel. The size of area occupied by the light emitting units 20 and the IC chip 50 is preferably 30% or less, preferably 20% or less, and still more preferably 10% or less, with respect to the entire size of area of the display area.

In the illustrated embodiment, although the strip unit 30B (the transparent conductive film 35) is arranged on the transparent substrate 10, the strip unit 30B or a part of the strip unit 30B may be embedded in the transparent substrate 10. In the illustrated embodiment, the strip unit 30B is arranged in a two-dimensional and regular manner, but the strip unit 30B may be arranged in an irregular manner. For example, the width, interval, the order of arrangement, the material, and the like of the transparent conductive film 35 can be partially changed. In the second embodiment, a part of the strip unit 30B may be changed to the linear-shaped body shown as the strip unit 30A according to the first embodiment explained above. Further, like the first embodiment, the second embodiment may also be configured such that a second transparent substrate 12 may be further arranged, and constituent elements such as the light emitting units 20, the strip unit 30B, and the like are laminated between the two transparent substrates.

Third Embodiment (Glass Provided with Transparent Display Apparatus)

The transparent display apparatus according to the first embodiment and the second embodiment explained above can be used as being attached to a plate-like body and can be used as being sealed between two plate-like bodies. Such a plate-like body is preferably transparent. The plate-like body may be, for example, an inorganic material such as flat glass, or an organic material such as polycarbonate or acrylic resin.

Figure 12:
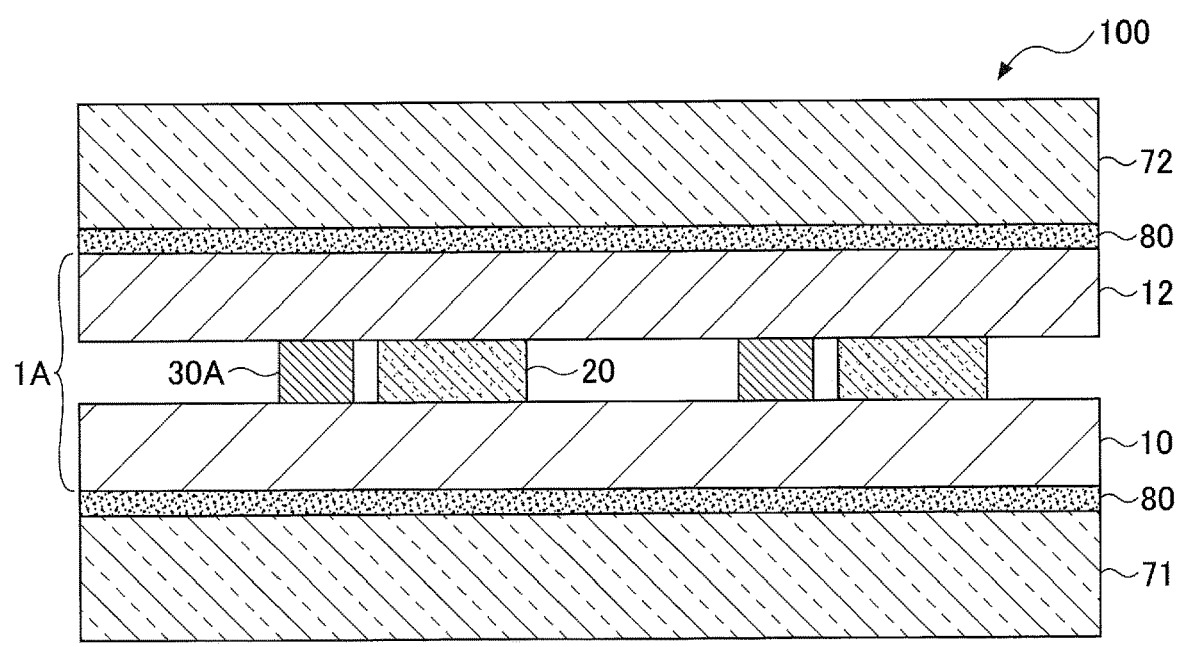
FIG. 12 is a schematic cross sectional view for explaining a basic configuration of a third embodiment (laminated glass).

FIG. 12 schematically illustrates a configuration in which the transparent display apparatus 1A according to the first embodiment is laminated between two plate-like bodies. FIG. 12 schematically illustrates a laminated glass 100 obtained by using flat glasses 71, 72 as both plate-like bodies. The laminated glass 100 can be produced by placing the transparent display apparatus 1A thus obtained on the first flat glass 71 and further stacking and bonding the second flat glass 72.

The first and second flat glasses may be either inorganic glass or organic glass. Examples of the inorganic glass include soda lime glass. The inorganic glass may be either non-tempered glass or tempered glass. The non-tempered glass is obtained by forming molten glass into a plate and slowly cooling it. The tempered glass is formed by forming a compressive stress layer on a surface of a non-tempered glass. The tempered glass may be either a physically tempered glass (for example, heat tempered glass) or a chemically tempered glass. Examples of organic glass include transparent resins such as polycarbonate. Laminated glass or insulated glazing may be made by using two or more sheets of glass for at least one of the first flat glass 71 or the second flat glass 72. Any one of the first flat glass 71 and the second flat glass 72 preferably has a thickness of 0.5 to 5 mm and more preferably 1.5 to 2.5 mm. The first flat glass 71 and the second flat glass 72 may have the same material, configuration, and thickness as each other, or may have different material, configuration, and thickness from each other.

In the above manufacturing, on at least one of both surfaces of the display apparatus 1A, an adhesive agent or an adhesive layer 80 functioning as an adhesive agent can be arranged between the display apparatus 1A and the flat glass. Therefore, the transparent display apparatus 1A can be stabilized within the laminated glass. The material of the adhesive layer 80 may be an interlayer film containing, as a main component, cycloolefin copolymer (COP), vinyl acetate copolymer (EVA), polyvinyl butyral (PVB), and the like. The adhesive layer 80 can be provided on the entire or a part of the transparent display apparatus 1A.

Further, the glass 100 provided with the transparent display apparatus is not limited to flat glass, and may have a curved surface. That is, the glass 100 provided with the transparent display apparatus may be curved. This curve may be in one direction, or the glass may be curved in two directions, i.e., a first direction and a second direction orthogonal to the first direction.

In order to obtain the curved laminated glass 100, the transparent display apparatus 1A obtained as described above may be heat-treated in advance, and placed on the first flat glass 71 processed into a curved shape, and further, the second flat glass 72 heat-treated in advance and processed into a curved shape in a manner similar to the first flat glass 71 is stacked, and thereafter, the first flat glass 71, the transparent display apparatus 1A, and the second flat glass 72 thus stacked may be heated and pressurized. In a case where the second flat glass 72 is sufficiently thinner than the first flat glass 71, the second flat glass 72 does not have to be processed into a curved shape in advance.

In a case where the transparent display apparatus 1B is used instead of the transparent display apparatus 1A, the laminated glass 100 having the same configuration can be obtained according to a similar manufacturing method.

The glass 100 provided with the transparent display apparatus according to the third embodiment can be preferably used for applications in which the visual recognition distance (i.e., the distance from the observer to the display screen) is, for example, 0.25 to 4.0 m. Examples of applications include the use in vehicles such as automobiles and railroad vehicles, buildings, and transparent objects. More specifically, the laminated glass 100 can be used by being incorporated into at least a part of: a windshield, rear window, side window, roof window, and the like in automobiles; window glass and advertisements hung from the ceiling of other transportation systems such as trains; and show windows, showcases, and shelves with doors in stores.

In this manner, even when the laminated glass 100 is used for applications in which the visual recognition distance is relatively short, the laminated glass 100 can secure transparency to allow images on the back surface side to be seen while the display performance is maintained, because the very small LEDs are used, and a low transmittance area is provided at a predetermined rate as described above.

Figure 13:
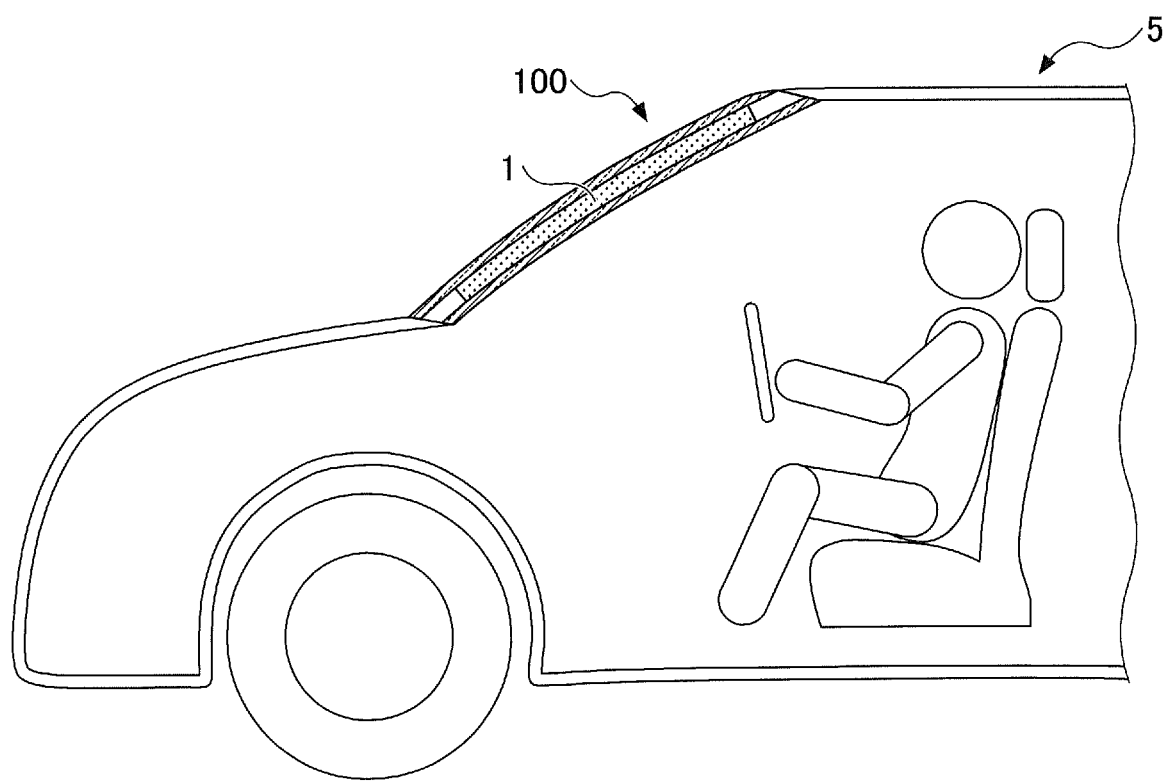
FIG. 13 is a drawing illustrating an example of application of a third embodiment (laminated glass).

FIG. 13 schematically illustrates an example in which the laminated glass 100 having the transparent display apparatus 1 is used as a windshield of an automobile. FIG. 13 is a schematic cross sectional view of a front portion of the automobile. In the illustrated laminated glass 100, the transparent display apparatus 1 may be the transparent display apparatus 1A according to the first embodiment or the transparent display apparatus 1B according to the second embodiment.

The laminated glass 100 used in an automobile 5 is curved. More specifically, the laminated glass 100 is curved in at least two directions of the laminated glass 100, and, for example, an axis extending in the horizontal direction and an axis extending in a direction orthogonal to the horizontal direction of the laminated glass 100 are curved. In the illustrated embodiment, the transparent display apparatus 1 is sealed throughout the entire surface of the laminated glass 100, but the range in which the transparent display apparatus 1 is provided may be a part of the laminated glass 100, for example, 50% or less or 30% or less of the size of area of the laminated glass 100.

EXAMPLES

[1. Evaluation of Double Image Test]

How much the diffraction of light emitted from the back surface side can be suppressed was studied in a case where the width of strips, the pixel pitch, and the like in the transparent display apparatus were changed. A transparent display apparatus in which LEDs and IC chips were arranged on pads was assumed, and photomask patterns as shown in Examples 1 to 8 explained below were produced, and a double image test was conducted on each Example.

Example 1

A pattern as illustrated in FIG. 14A was adopted as a pixel pattern, and by using a photomask pattern in which these pixel patterns were arranged in a matrix form, Example 1 was produced by printing chrome on a transparent soda lime glass substrate. The size of area of the photomask pattern was about 50 mm×50 mm.

In the photomask pattern, an area occupied by the pad and the strip unit (i.e., a black area in the figure) was a non-transmitting portion (the transmittance is about 0%), and the area other than that had a transmittance of about 100%.

In the photomask pattern of Example 1, the strip width was 6 μm, and the pixel pitch was 360 μm. The size of area of the pad was 10000 μm$^2$, and the ratio of the size of area of the non-transmitting portion in a single pixel was 16%.

Example 2

A photomask pattern was prepared in a manner similar to Example 1 except that the strip width was 3 μm. A single pixel pattern of Example 2 was illustrated in FIG. 14B.

Example 3

A photomask pattern was prepared in a manner similar to Example 1 except that the pixel pitch was 720 μm. A single pixel pattern of Example 3 was illustrated in FIG. 14C.

Example 4

A photomask pattern was prepared in a manner similar to Example 1 except that the pattern of the strip unit and the pad were brought into proximity as illustrated in FIG. 14D.

Example 5

A photomask pattern was prepared in a manner similar to Example 1 except that the pattern of the pad portion was not formed. A single pixel pattern of Example 5 was illustrated in FIG. 14E.

Example 6

A photomask pattern was prepared in a manner similar to Example 1 except that the size of area of the pad was 3200 μm$^2$ which was about one third of Example 1, and the strip width was 3 μm. A single pixel pattern of Example 6 was illustrated in FIG. 14F.

Example 7

A photomask pattern was prepared in a manner similar to Example 1 except that the strip width was 3 μm, and the pixel pitch was 720 μm. A single pixel pattern of Example 7 was illustrated in FIG. 14G.

Example 8

A photomask pattern was prepared in a manner similar to Example 1 except that strip width was 3 μm, the pixel pitch was 720 µm, and the pattern of the strip unit and the pad were brought into proximity as illustrated in FIG. 14H.

<Double Image Test>

Using the photomask patterns of Examples 1 to 8, double image test according to JIS R3212 was performed as follows.

First, an illumination box 2 having a light source placed inside was prepared. FIG. 15 (a) illustrates a front view of the illumination box 2, and FIG. 15 (b) illustrates a cross sectional view taken along line I-I. The illumination box 2 was 300 mm high×300 mm wide×150 mm deep with its front being painted with black matte paint. On the front, a spot 3 having a diameter of 12.7 mm and a ring-shaped slit having a width of 2 mm around the spot 3 were formed. On the inner side of the front of the illumination box, an orange filter 5 was attached.

A photomask pattern was placed as a test body 1 at a position 7 m away from the front of the illumination box 2 (FIG. 15 (c)). The image of the photomask pattern was taken on the opposite side of the illumination box 2 and suppression of diffraction was evaluated. In this evaluation, whether the spot light was on the ring was evaluated. The evaluation scale was as follows, and evaluation was performed into A to E, with Example 1 being the reference (evaluation: D).

- A: The diffraction of the spot light was not observed or was extremely weaker than Example 1, and cross diffraction was also not observed or was extremely weaker than Example 1.
- B: The diffraction of the spot light was weaker than Example 1, and the cross diffraction was also weaker than Example 1.
- C: The diffraction of the spot light was about the same as or stronger than Example 1, but the cross diffraction was weaker than Example 1.
- D: The strength of the diffraction of the spot light and the strength of the cross diffraction were both about the same as Example 1.
- E: As compared to Example 1, both the diffraction of the spot light and the cross diffraction were stronger.

Example 9

A single pixel pattern as illustrated in FIG. 16A was generated. In the pattern image of Example 9, it is assumed that a pad was not provided, the width of strip was 5 µm, and the pixel pitch was 360 µm. In this image, the area occupied by the LEDs, the IC chip, and the strip unit (i.e., a black area in the figure) was a non-transmitting portion (the transmittance is about 0%), and the area other than that had a transmittance of about 100%. The effect of diffracted light suppression of pattern images obtained by aggregating such pixel patterns was evaluated as described later.

Example 10

A single pixel pattern was prepared in a manner similar to Example 9 except that the strip width was 3 µm. A single pixel pattern used in Example 10 is illustrated in FIG. 16B.

Example 11

A single pixel pattern was prepared in a manner similar to Example 9 except that the vertical strip width was 25 µm. A single pixel pattern used in Example 11 is illustrated in FIG. 16C.

Example 12

A single pixel pattern different from Example 9 in that each strip was in a zigzag shape as illustrated in FIG. 16D was prepared. In the pattern of Example 12, the strips were constituted by straight lines, but were configured to be repeatedly bent so as to have corners. The wavelength λ of repetitions of the strips of Example 12 was 20 µm, and the amplitude A was 12.5 µm (an enlarged view of FIG. 16D).

Example 13

A single pixel pattern different from Example 9 in that each strip was in a curved wave shape as illustrated in FIG.

TABLE 1

|  |  | Example 1 | Example 2 | Example 3 | Example 4 | Example 5 | Example 6 | Example 7 | Example 8 |
|---|---|---|---|---|---|---|---|---|---|
| Config- | Line width (µm) | 6 | 3 | 6 | 6 | 6 | 3 | 3 | 3 |
| uration | Pixel pitch (µm) | 360 | 360 | 720 | 360 | 360 | 360 | 720 | 360 |
|  | Size of area of pad (µm²) | 10000 | 10000 | 10000 | 10000 | No pad | 3200 | 10000 | 10000 |
| Evaluation of double image test*¹ |  | D | C | B | E | B | C | A | B |

*¹Example 1 was adopted as a reference (evaluation: D).

It was found from Table 1 that the effect of diffracted light suppression was improved in Examples with smaller strip widths (Example 3 and Examples 6 to 8), Examples with larger pixel pitches (Example 3 and Example 7), and Examples in which the sizes of areas of the pad are smaller (Example 5 and Example 6).

[2. Evaluation I by Simulation]

How much the diffraction phenomenon of light from the back surface side can be suppressed was studied in a case where the width of strips, the linearity of strips, and the like in the transparent display apparatus were changed. A transparent display apparatus having three LEDs, a single IC chip, and a strip unit for each pixel was assumed, and pattern images were prepared as in Examples 9 to 14, and simulation for emitting light onto these images was generated with a personal computer to derive diffracted lights.

16E was prepared. In other words, in Example 13, the strips were configured to be curved with a repeated uneven pattern without corners. The wavelength λ of repetitions of the strips of Example 13 was 20 µm, and the amplitude A was 12.5 µm (an enlarged view of FIG. 16E).

Example 14

A single pixel pattern different from Example 13 in that each strip was in a curved wave shape as illustrated in FIG. 16F was prepared. The pattern of Example 14 was similar to Example 13 in that the pattern of Example 14 has the strips in curved line shapes with a repeated uneven pattern without corners, but was different from the pattern of Example 13 in that the wavelengths of curved wave shapes of some of the strips are larger than the wavelength used in Example 13. More specifically, in Example 14, the wavelengths of curved wave shapes of the patterns of two strips closest to the LEDs and the IC chip were changed to be larger. Of the changed wavelengths in Example 14, the larger wavelength λ was 80 μm.

of the light intensity of the light source and the like was calculated from the light spots included in the scattered light other than the 0th order light. Further, the calculated value for Example 9 was defined as one, and Example 9 and Example 10 to Example 14 were compared. Table 2 shows the result.

TABLE 2

| | | Example 9 | Example 10 | Example 11 | Example 12 | Example 13 | Example 14 |
|---|---|---|---|---|---|---|---|
| Config- uration | Line width (μm) | 5 | 2.5 | 25 | 5 | 5 | 5 |
| | Strip shape | Straight line | Straight line | Straight line | Zigzag shape (Triangular wave shape) | Curved wave shape | Curved wave shape (including strips of different cycles) |
| | Total number of light spots having light intensities (lm) of 10% or more except 0th order light | 30 | 18 | 32 | 0 | 0 | 0 |
| | Evaluation of diffracted light suppression effect*[2] | 1.00 | 0.60 | 1.07 | 0.00 | 0.00 | 0.00 |

*[2]Evaluation using Example 9 as reference

<Evaluation of Diffracted Light Suppression>

Diffracted lights obtained by emitting light having a wavelength 533 nm to patterns (model images) in which pixel patterns explained in Example 9 to 14 were infinitely arranged in both of the x direction and the y direction were calculated, and diffracted light images were generated. The diffracted light suppression was evaluated from the obtained diffracted light images. For the calculation, the following expression (1) described in "Introduction to Fourier Optics" (Joseph W. Goodman, ISBN: 0-9747077-2-4) was used.

[Math 1]

$$A(f_X, fY, 0) = \int\int_{-\infty}^{\infty} U(x, y, 0)\exp(-j2\pi(fXx + fYy))dxdy \quad (1)$$

In the expression (1), "A" denotes a value proportional to the complex amplitude of the diffraction efficiency of the orders of diffractions fX and fY. "U (x, y, 0)" represents a transmittance distribution and a phase distribution on the transparent display apparatus. "x, y" denotes coordinates on the transparent display apparatus, and it is assumed that one pixel corresponds to one pixel, and the origin exists in the pixels.

In a case where a person sees a light spot in the background (environment light), the human brain (eyes) generally cannot recognize the light spot of which the brightness is less than $10^{-1}$% with respect to the background brightness. In contrast, light sources that illuminate the surroundings at night are often 1000 times brighter than the areas illuminated by these light sources. Therefore, when a person sees a background including a light source and the like through a member that may generate diffracted light at night, the diffracted light can be recognized by the brain (eyes) if the strength of each order of the diffracted light is $10^{-4}$% or more with respect to the light source and the like. In other words, the human brain (eyes) cannot recognize light spots of light quantities that are less than $10^{-4}$% of the light intensity of the light source and the like among the light spots included in the scattered light other than the 0th order light. Therefore, in the evaluation of the diffracted light suppression, in Example 9 to Example 14, the total number of light spots having light quantities (1 m) of $10^{-4}$% or more As described in Table 2, even in a case where the strip patterns were straight lines, and even in a case where the line width was thin (Example 10) or the strip width was the same as Example 9, it was found that the strip pattern in the zigzag shape or the triangular wave shape (Example 12), the strip pattern in the curved wave shape (Example 13), and the strip pattern in the curved wave shape including strips of different wavelengths (Example 14) had a higher effect of diffracted light suppression than Example 9. In contrast, it was found that, in a case where the strip pattern was the straight line and the strip width was thick (Example 11), the effect of diffracted light suppression was lower than Example 9.

[3. Evaluation II of Simulation]

Suppression of diffraction phenomenon of light in a case where the configuration of the strips of the transparent display apparatus was changed is further studied. A model image having a predetermined pixel pattern was prepared, and simulation for emitting light to the model image was performed. More specifically, a diffracted light image was prepared from the model image through calculation on a personal computer, and suppression of diffraction phenomenon was evaluated on the basis of the diffracted light image. It should be noted that the model image and the diffracted light image of the pixel pattern were generated using a grayscale (including 256 levels ranging from 0 to 255; a level value of 0 represents black, and a level value of 255 represents white).

Example 15

A photomask image having a single pixel pattern as illustrated in FIG. 17A was prepared. In the image according to this Example, each strip was in a straight line shape, and the width of the strip was 5 μm, and the pixel pitch was 360 μm. Elements such as LEDs were configured to be arranged on the pad, and the size of area of the pad (i.e., a rectangular portion PS illustrated in the figure) was 10000 μm². The area occupied by the constituent elements (i.e., a black area in the figure) was a non-transmitting portion having a transmittance of 0%, and the level value of the area of the non-transmitting portion was 0. The area other than the area of the non-transmitting portion (i.e., a white area in the figure)

was a transmitting portion having a transmittance of 100%, and the level value of the area of the transmitting portion was 255.

Example 16

In this Example, a photomask image having a pattern similar to Example 15 except that each strip was in a waveform of a sine curve as illustrated in FIG. 17B was prepared. In this Example, the waveforms of the strips included a curved uneven pattern that is repeatedly provided. The wavelength λ of repetitions was 72 μm, and the amplitude A was 3.52 μm (an enlarged view of FIG. 17B).

Example 17

A photomask image having a pattern similar to Example 16 was prepared except that the shape of each strip was a sine curve as illustrated in FIG. 17C, the wavelength λ of repetitions in the waveform was 72 μm, and the amplitude A was 14.10 μm.

Example 18

A photomask image having a pattern similar to Example 16 was prepared except that the shape of each strip is a sine curve as illustrated in FIG. 17D, the wavelength λ of repetitions of the waveform was 72 μm, and the amplitude A was 7.05 μm.

<Evaluation of Light Intensity>

Diffracted lights obtained by emitting light having a wavelength of 533 nm to the centers of the model images generated in Example 15 to Example 18 (i.e., patterns in which the illustrated pixel patterns were infinitely arranged in both of the x direction and the y direction) were calculated, and diffracted light images were prepared. In this example, the diffracted light images were displayed in linear scale. FIGS. 20A to 20D illustrate diffracted light images of Example 15 to Example 18.

Figure 21:
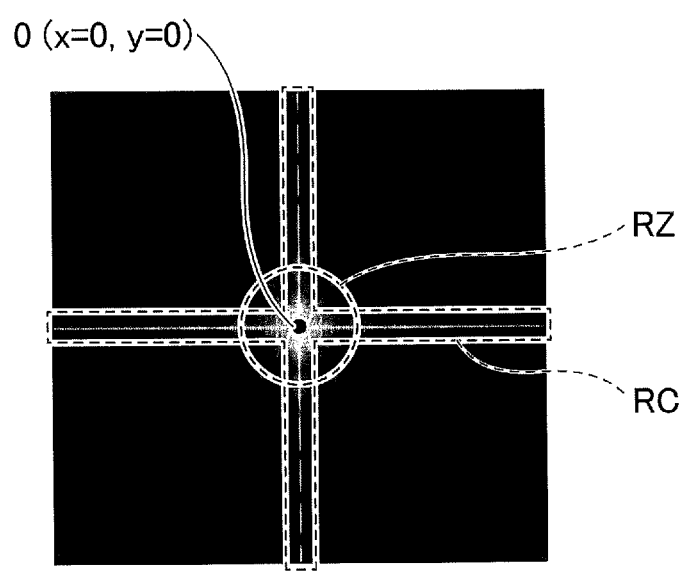
FIG. 21 is a drawing for explaining the 0th order light and the 10th order light in evaluation of light intensity.

The diffracted light suppression was evaluated based on the obtained diffracted light images. Specifically, the ratio of the size of area of white portions in a single pixel in each diffracted light image was calculated as a total light intensity. In this evaluation II, a range having a certain extension from the center of the image (the center of the illumination light, i.e., a point ○ (x=0, y=0)) was calculated. In other words, the rate of the size of area of the white portions in a range within a radius of 20 pixels (RZ of FIG. 21) was calculated as "0th order light intensity", and the rate of the size of area of the white portions in a range of pixels at x=−5 to 5 or pixels at y=−5 to 5 (RC of FIG. 21) was calculated as "cross light intensity".

<Sensory Evaluation>

Sensory evaluation was also performed on the diffracted light images obtained in Example 15 to Example 18. In the sensory evaluation, each diffracted light image was filtered through a high-pass filter, and a gray portion having a level value of 128 or less was converted into a non-transmitting portion (a level value of 0). With this kind of filter processing, a gray portion close to black that is actually less likely to be visually observed by an observer is treated as the non-transmitting portion, so that a diffracted light image that is actually observed by the observer can be generated. FIGS. 22A to 22D illustrate filtered diffracted light images of Example 15 to Example 18.

Further, the filtered diffracted light image was visually evaluated. This evaluation was to evaluate suppression of diffracted light, and specifically, whether the light appears to be uniform was evaluated as an overall impression, using Example 15 as a reference. The evaluation scale was as follows.

A: The light appeared to be significantly more uniform than Example 15.
B: The light appeared to be more uniform than Example 15.
C: The light appeared to be somewhat more uniform than Example 15.
D: The uniformization of the light was about the same degree as Example 15.

Table 3 illustrates an example of results of the above evaluation of light intensity and sensory evaluation of Example 15 to Example 18.

TABLE 3

| | | Example 15 | Example 16 | Example 17 | Example 18 |
|---|---|---|---|---|---|
| Configuration of strips | Line width (μm) | 5 | 5 | 5 | 5 |
| | Shape | Straight line | Sine curve | Sine curve | Sine curve |
| | Amplitude (μm) | — | 3.52 | 14.1 | 7.05 |
| | Cycle (μm) | — | 72 | 72 | 72 |
| | Amplitude/Cycle | — | 0.0489 | 0.1958 | 0.0979 |
| Before filter processing | Total light intensity | 0.847 | 0.844 | 0.838 | 0.824 |
| | 0th order light intensity | 0.812 | 0.807 | 0.799 | 0.778 |
| | 10th order light intensity | 0.032 | 0.017 | 0.010 | 0.008 |
| After filter processing | Total light intensity | 0.845 | 0.839 | 0.833 | 0.818 |
| | 0th order light intensity | 0.812 | 0.807 | 0.799 | 0.778 |
| | 10th order light intensity | 0.031 | 0.017 | 0.009 | 0.008 |
| | Sensory evaluation[*3] | D | C | B | A |

[*3]Example 15 was adopted as a reference (evaluation: D).

It was found from Table 3 that strips having shapes of sine curves (Example 16 to Example 18) more greatly suppressed diffracted light than strips in shapes of straight lines (Example 15). It was found that, in a range of Example 16 to Example 18, as the value of "amplitude/wavelength" increased, the effect of diffracted light suppression increased.

Example 19

A photomask image in a pattern similar to Example 15 except that the transmittance increased in a stepwise manner from edge portions of strips toward outer sides (i.e., transmittance gradations were provided) was prepared. Specifically, as illustrated in FIG. 18A, a strip 31A included high transmittance edge portions 312 at side edge portions of a strip main body 311, and this high transmittance edge portion 312 included: a first high transmittance area 312a (a level value of 128) having a higher transmittance than the transmittance of the strip main body 311 and having a width of 0.5 µm to extend from an edge portion of a strip having a width of 5 µm; and a second high transmittance area 312b (a level value of 194) having a higher transmittance than the first high transmittance area 312a and having a width of 0.5 µm to extend from the edge portion of the first high transmittance area 312a. The level value of 194 of the second high transmittance area 312b is a value that is 76% of the level value of 255 for white. The level value of 128 of the first high transmittance area 312a is a value that is 50% of the level value of 255 for white.

Example 20

A photomask image in a pattern similar to Example 15 except that very small uneven patterns were formed on the edge portions of strips was prepared. Specifically, as illustrated in FIG. 18B, non-transmitting portions in circular shapes having a radius of 1.0 µm and non-transmitting portions in circular shapes having a radius of 2.5 µm were randomly provided so as to overlap the edge portions of the strip unit in a straight line shape having a line width of 1 µm and the edge portions of the pad, so that the contours of the strips had very small uneven patterns. It should be noted that the size of area of the non-transmitting portion in this Example was the same as the size of area of the non-transmitting portion in Example 15. Although the line widths of the strips vary depending on the positions, the line widths were configured not to exceed 8.0 µm.

The above evaluation of light intensity and sensory evaluation were also performed on Example 19 and Example 20. The result is shown in Table 4 (Example 15 is shown again).

It was found from Table 1 that the effect of the diffracted light suppression was achieved by applying processing for making a very small uneven pattern to the contours of the edge portions of the strips (Example 19 and Example 20). Although the total width of the strip of Example 19 and the maximum width of the strip of Example 20 were both larger than the strip width of Example 15, Example 19 and Example 20 had a higher suppression effect of diffracted light than Example 15.

Example 21

Figure 19A:
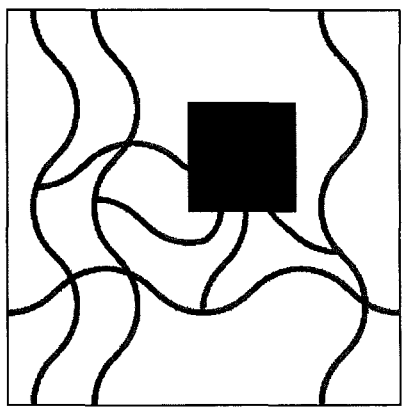
FIGS. 19A and 19B are drawings illustrating image patterns used in Example 21 and Example 22.

A photomask image in a pattern similar to Example 16 was prepared, except that the shape of each strip is a sine curve as illustrated in FIG. 19A, the wavelength λ of repetitions of the waveform was 180 µm, and the amplitude A was 17.6 µm.

Example 22

Figure 19B:
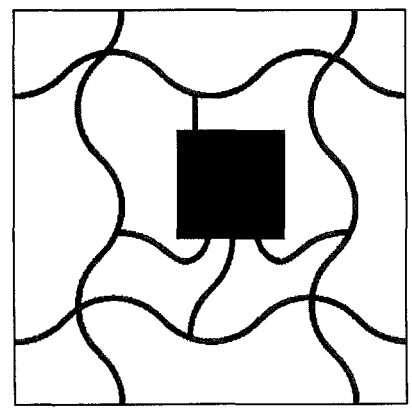

The difference from Example 21 lies in that the shape of the strip of the pattern of this Example was a sine curve having a wavelength λ and an amplitude A similar to Example 21, but as illustrated in FIG. 19B, a value of a ratio (Nx/Ny) of the number (Nx) of strips extending in the row direction (x direction) to the number (Ny) of strips extending in the column direction (y direction) in a pixel was different from Example 21. In Example 21, the value of the ratio (Nx/Ny) was about 0.33, but in this Example 22, the value of the ratio (Nx/Ny) was 1.0.

The above evaluation of light intensity was performed on Example 21 and Example 22 in a similar manner. In addition, sensory evaluation of suppression of diffracted light was also performed, but the evaluation was performed by making comparison between Example 21 and Example 22. In other words, the evaluation was to determine, when a diffracted light image of Example 22 was seen, whether the light was more greatly uniformized as compared with Example 21. Table 5 shows the result.

TABLE 4

| | | Example 15 | Example 19 | Example 20 |
|---|---|---|---|---|
| Processing of edge portions of strips | | — | High transmittance edge portions were formed | Formation of uneven pattern |
| Before filer processing | Total light intensity | 0.847 | 0.835 | 0.844 |
| | 0th order light intensity | 0.812 | 0.805 | 0.808 |
| | 10th order light intensity | 0.032 | 0.027 | 0.020 |
| After filter processing | Total light intensity | 0.845 | 0.833 | 0.836 |
| | 0th order light intensity | 0.812 | 0.805 | 0.808 |
| | 10th order light intensity | 0.031 | 0.027 | 0.020 |
| | Sensory evaluation*[4] | D | B | A |

*[4]Example 15 was adopted as a reference (evaluation: D).

TABLE 5

| | | Example 15 | Example 19 | Example 20 |
|---|---|---|---|---|
| Processing of edge portions of strips | | — | High transmittance edge portions were formed | Formation of uneven pattern |
| Before filer processing | Total light intensity | 0.847 | 0.835 | 0.844 |
| | 0th order light intensity | 0.812 | 0.805 | 0.808 |
| | 10th order light intensity | 0.032 | 0.027 | 0.020 |
| After filter processing | Total light intensity | 0.845 | 0.833 | 0.836 |
| | 0th order light intensity | 0.812 | 0.805 | 0.808 |
| | 10th order light intensity | 0.031 | 0.027 | 0.020 |
| | Sensory evaluation*4 | D | B | A |

*5: In comparison with Example 21, whether light is uniformized is evaluated.

It was found from Table 5 that Example 22 of which the value of the ratio (Nx/Ny) of the number of strips extending in the row direction to the number of strips extending in the column direction was close to 1 achieves a higher effect of diffracted light suppression than Example 21.

What is claimed is:

1. A transparent display apparatus comprising:
a first transparent substrate;
light emitting units arranged for respective pixels on the first transparent substrate; and
a strip unit connected to the light emitting units,
wherein each of the light emitting units includes at least one light emitting diode having a size of area of 10,000 μm² or less,
a size of area having a transmittance of 20% or less accounts for 30% or less of a display area,
wherein the strip unit includes a strip of a linear-shaped body of which width is 100 μm or less, and
wherein the strip includes a strip main body and a side edge portion formed along the strip main body, and a high transmittance edge portion, of which transmittance is higher than the strip main body, is formed in at least a part of the side edge portion.

2. The transparent display apparatus according to claim 1, wherein the strip is arranged so that a tangential line direction changes in a plan view.

3. The transparent display apparatus according to claim 2, wherein the strip is arranged in a shape of a wave in the plan view, and
a value of a ratio of an amplitude to a wavelength is 0.005 to 1.

4. The transparent display apparatus according to claim 2, wherein the strip includes a differentiable curved portion in the plan view.

5. The transparent display apparatus according to claim 2, wherein a length of a straight portion of the strip is 500 μm or less.

6. The transparent display apparatus according to claim 1, wherein the strip includes an uneven pattern on a side edge portion.

7. The transparent display apparatus according to claim 1, wherein a value of a ratio of a number of strips extending in one direction divided by a number of strips extending in a direction orthogonal to the one direction in one of the pixels ranges from 0.2 to 5.

8. The transparent display apparatus according to claim 1, wherein the strip unit includes a transparent conductive film.

9. The transparent display apparatus according to claim 1, further comprising at least one driving semiconductor chip connected to a light emitting unit in one pixel or light emitting units in a plurality of pixels.

10. The transparent display apparatus according to claim 1, wherein each of the light emitting units includes three light emitting diodes of which wavelengths of light emissions are different from each other.

11. The transparent display apparatus according to claim 1, wherein at least the light emitting units are laminated between the first transparent substrate and a second transparent substrate.

12. The transparent display apparatus according to claim 1, wherein a light emitting efficiency of the light emitting diode is 1% or more.

13. The transparent display apparatus according to claim 1, wherein the light emitting diode is made of an inorganic material.

14. The transparent display apparatus according to claim 1, wherein a pitch of the pixels is 100 to 3000 μm.

15. The transparent display apparatus according to claim 1, wherein a transmittance in each of the pixels is 70% or more.

16. A glass provided with the transparent display apparatus of claim 1, wherein the transparent display apparatus is laminated between a first glass plate and a second glass plate.

17. The glass provided with the transparent display apparatus according to claim 16, wherein the laminated glass is curved.

18. A transparent display apparatus comprising:
a first transparent substrate;
light emitting units arranged for respective pixels on the first transparent substrate; and
a strip unit connected to the light emitting units,
wherein each of the light emitting units includes at least one light emitting diode having a size of area of 10,000 μm² or less,
a size of area having a transmittance of 20% or less accounts for 30% or less of a display area,
wherein the strip unit includes a strip of a linear-shaped body of which width is 100 μm or less,
wherein the strip is arranged so that a tangential line direction changes in a plan view,
wherein the strip is arranged in a shape of a wave in the plan view, and wherein an amplitude of the wave is from 1 to 500 μm a wavelength of the wave is 1000 μm or less, and a value of a ratio of the amplitude wave to the wavelength of the wave is 0.005 to 0.5.

19. The transparent display apparatus according to claim 18, wherein the amplitude of the wave is from 2.5 to 180 μm the wavelength of the wave is 50 to 600 μm and the value of the ratio of the amplitude wave to the wavelength of the wave is 0.005 to 0.3.

20. The transparent display apparatus according to claim 18, wherein the amplitude of the wave is from 5 to 60 μm, the wavelength of the wave is 100 to 400 μm and the value of the ratio of the amplitude wave to the wavelength of the wave is 0.005 to 0.15.

* * * * *